(12) United States Patent
Jimbo et al.

(10) Patent No.: US 12,339,595 B2
(45) Date of Patent: Jun. 24, 2025

(54) MEASUREMENT APPARATUS, LITHOGRAPHY APPARATUS, AND ARTICLE MANUFACTURING METHOD

(71) Applicant: CANON KABUSHIKI KAISHA, Tokyo (JP)

(72) Inventors: Satoru Jimbo, Tochigi (JP); Kazuhiko Mishima, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 227 days.

(21) Appl. No.: 18/062,080

(22) Filed: Dec. 6, 2022

(65) Prior Publication Data
US 2023/0185208 A1    Jun. 15, 2023

(30) Foreign Application Priority Data
Dec. 10, 2021  (JP) .................. 2021-201173

(51) Int. Cl.
*G03F 9/00* (2006.01)
*G06T 7/00* (2017.01)
*G06T 7/73* (2017.01)

(52) U.S. Cl.
CPC .......... *G03F 9/7088* (2013.01); *G03F 9/7023* (2013.01); *G06T 7/001* (2013.01); *G06T 7/74* (2017.01); *G06T 2207/20081* (2013.01); *G06T 2207/30148* (2013.01); *G06T 2207/30204* (2013.01)

(58) Field of Classification Search
CPC .... G03F 9/7023; G03F 9/7088; G03F 7/0002; G03F 9/7042; G03F 9/7092; G06T 2207/20081; G06T 2207/30148; G06T 2207/30204; G06T 7/001; G06T 7/74
See application file for complete search history.

(56) References Cited

U.S. PATENT DOCUMENTS

| | | | |
|---|---|---|---|
| 7,493,185 B2 | 2/2009 | Cheng et al. | |
| 2015/0011026 A1* | 1/2015 | Oishi | G03F 9/7092 356/401 |
| 2016/0131982 A1* | 5/2016 | Sugiyama | G03F 9/7088 355/67 |
| 2019/0122358 A1* | 4/2019 | Murayama | G06T 5/20 |
| 2019/0384182 A1* | 12/2019 | Takarada | G03F 7/70533 |
| 2022/0042936 A1* | 2/2022 | Okai | G06N 3/045 |
| 2022/0067958 A1* | 3/2022 | Jimbo | G01B 11/272 |

(Continued)

FOREIGN PATENT DOCUMENTS

JP    4601492 B2    12/2010

*Primary Examiner* — Deoram Persaud
(74) *Attorney, Agent, or Firm* — ROSSI, KIMMS & McDOWELL LLP

(57) ABSTRACT

A measurement apparatus that measures position information of a measurement target is provided. The apparatus includes a scope configured to generate an image by capturing an image of the measurement target, and a processor configured to obtain position information of the measurement target based on the image. The processor is configured to generate a plurality of image components using a statistical technique from a plurality of images generated by the scope, output the plurality of generated image components, perform processing based on the plurality of image components, and determine the position information based on a result of the processing.

16 Claims, 20 Drawing Sheets

(56) References Cited

U.S. PATENT DOCUMENTS

| | | | | |
|---|---|---|---|---|
| 2022/0130028 | A1* | 4/2022 | Jimbo | G06N 3/08 |
| 2022/0342324 | A1* | 10/2022 | Egashira | H01L 21/681 |
| 2022/0397832 | A1* | 12/2022 | Alpeggiani | G03F 9/7046 |
| 2023/0418168 | A1* | 12/2023 | Huisman | G03F 7/70633 |

* cited by examiner

F I G. 7
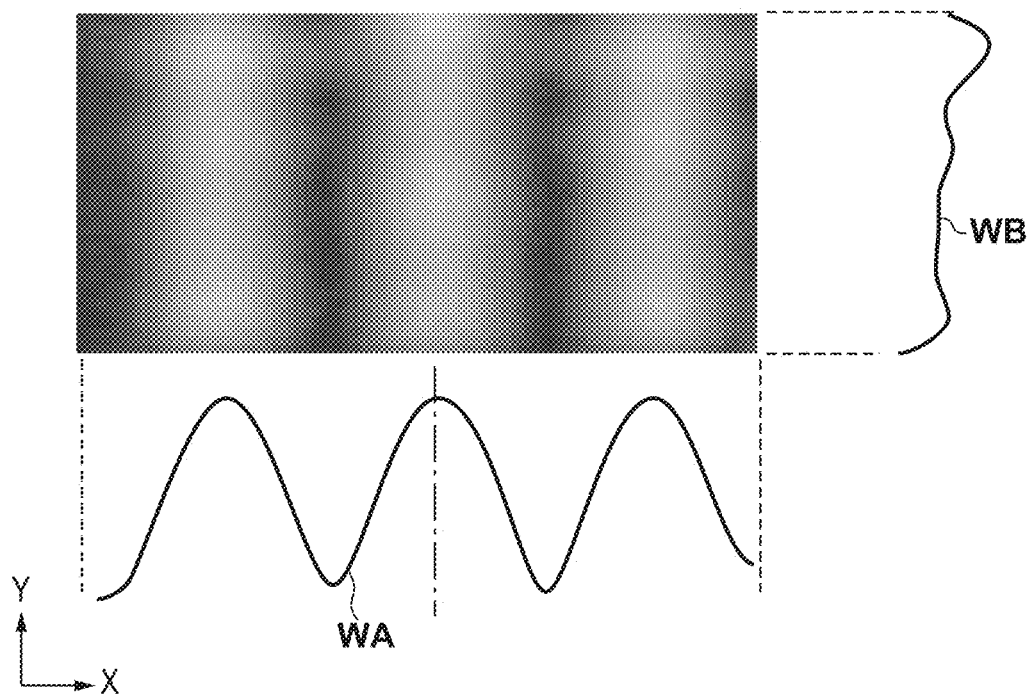
F I G. 8
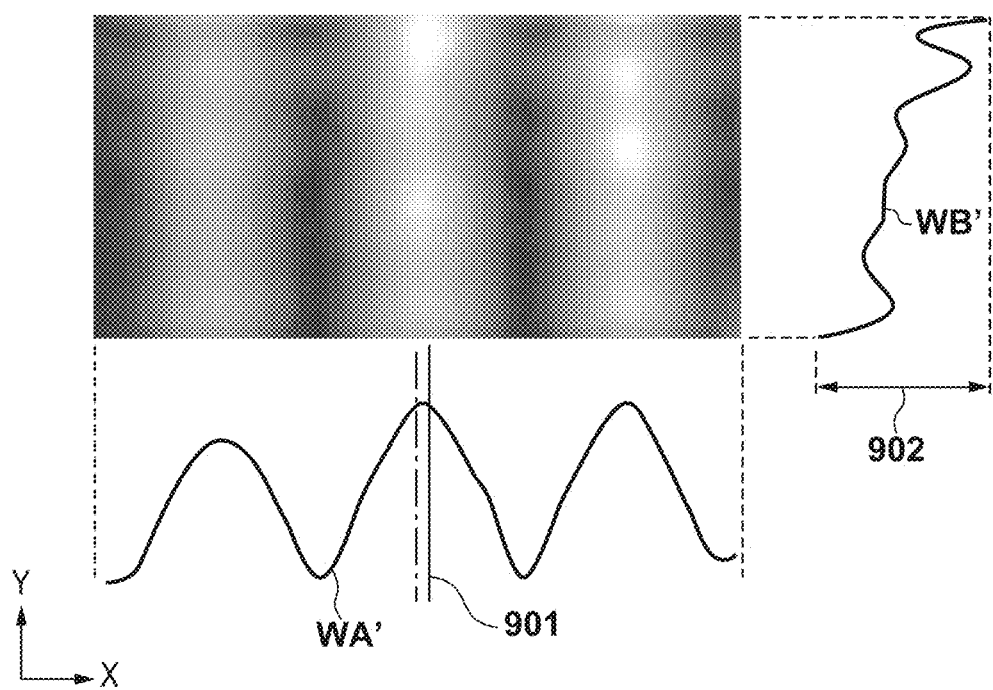

MEASUREMENT APPARATUS, LITHOGRAPHY APPARATUS, AND ARTICLE MANUFACTURING METHOD

BACKGROUND OF THE INVENTION

Field of the Invention

The present invention relates to a measurement apparatus, a lithography apparatus, and an article manufacturing method.

Description of the Related Art

In a lithography process for manufacturing an article such as a semiconductor device, a lithography apparatus such as an imprint apparatus or exposure apparatus can be used. The lithography apparatus can transfer a pattern of an original onto a shot region of a substrate. The imprint apparatus brings a mold into contact with an imprint material arranged on a shot region of a substrate and cures the imprint material to form a pattern made of a cured product of the imprint material on the shot region. An exposure apparatus can project a pattern of an original to a shot region of a substrate coated with a photosensitive material to form a latent image of the pattern of the original on the photosensitive material. The latent image is converted into a physical pattern by a development process. To accurately align the shot region of a substrate and an original, such lithography apparatuses require a technique for accurately measuring a relative position between a mark on the substrate and a mark on the original.

Japanese Patent No. 4601492 discloses a method of estimating an alignment correction value by using machine learning.

As the miniaturization of patterns to be formed on substrates increases, higher position measurement accuracy is required.

However, noise caused by various factors mixes in with images of measurement targets and hinders an increase in position measurement accuracy.

SUMMARY OF THE INVENTION

The present invention provides a technique advantageous in improving the robustness against noise so as to measure the position of a measurement target with high accuracy.

The present invention in its one aspect provides a measurement apparatus that measures position information of a measurement target, the apparatus includes a scope configured to generate an image by capturing an image of the measurement target, and a processor configured to obtain position information of the measurement target based on the image, wherein the processor is configured to generate a plurality of image components using a statistical technique from a plurality of images generated by the scope, output the plurality of generated image components, perform processing based on the plurality of image components, and determine the position information based on a result of the processing.

Further features of the present invention will become apparent from the following description of exemplary embodiments (with reference to the attached drawings).

BRIEF DESCRIPTION OF THE DRAWINGS

FIG. 7 is a view exemplarily showing a signal waveform obtained from the image data of an alignment mark;

FIG. 8 is a view exemplarily showing a signal waveform obtained from the image data of an alignment mark;

DESCRIPTION OF THE EMBODIMENTS

Figure 1:
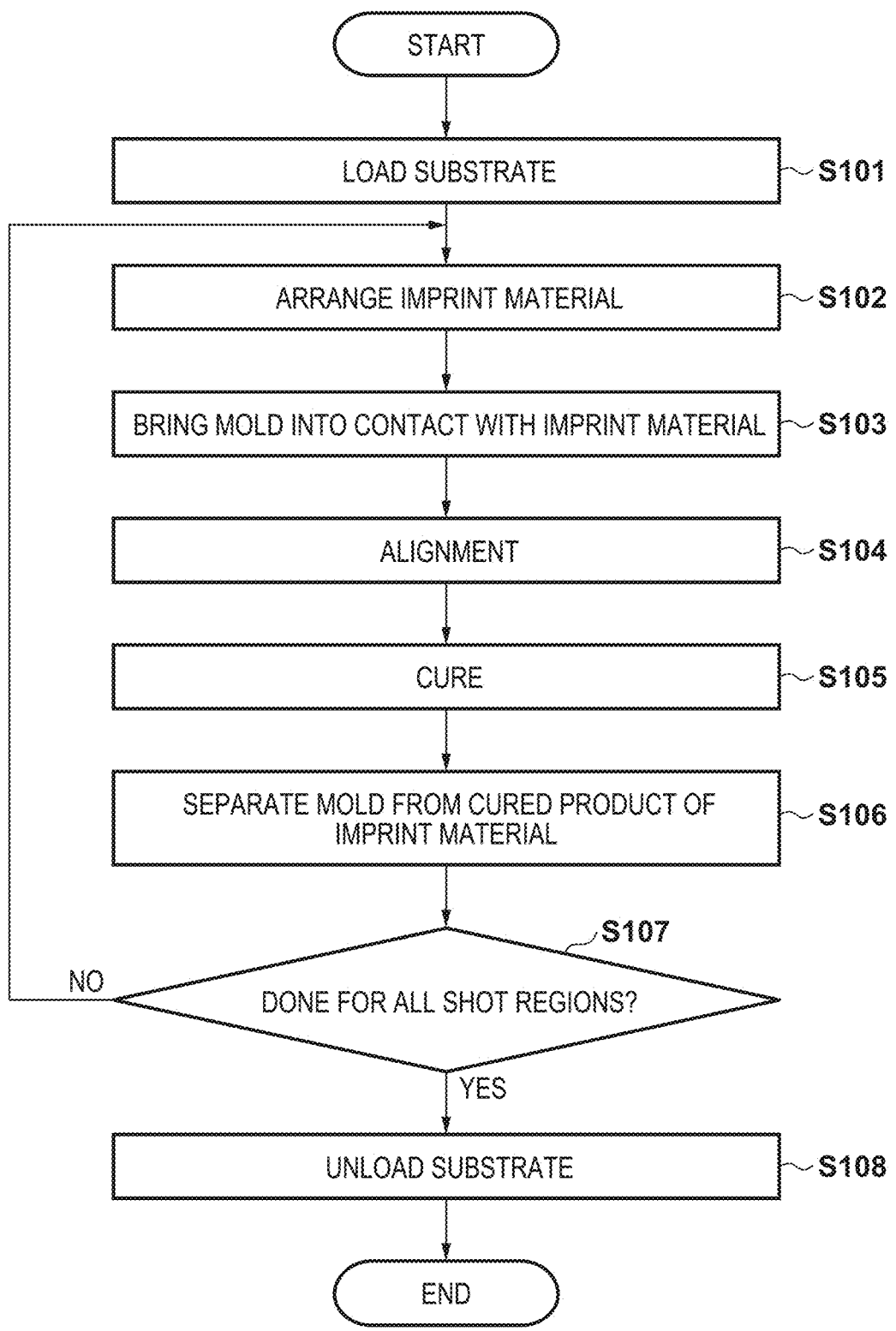
FIG. 1 is a flowchart exemplarily showing the operation of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

First Embodiment

Although in the first embodiment, an imprint apparatus will be described as an example of a lithography apparatus hereinafter, there are many commonalities between an imprint apparatus and an exposure apparatus in regards to a technique for aligning an original and a shot region of a substrate. Hence, an alignment technique to be described below can also be applied to an exposure apparatus. Accordingly, the exposure apparatus will be described as the second embodiment.

Figure 2A:
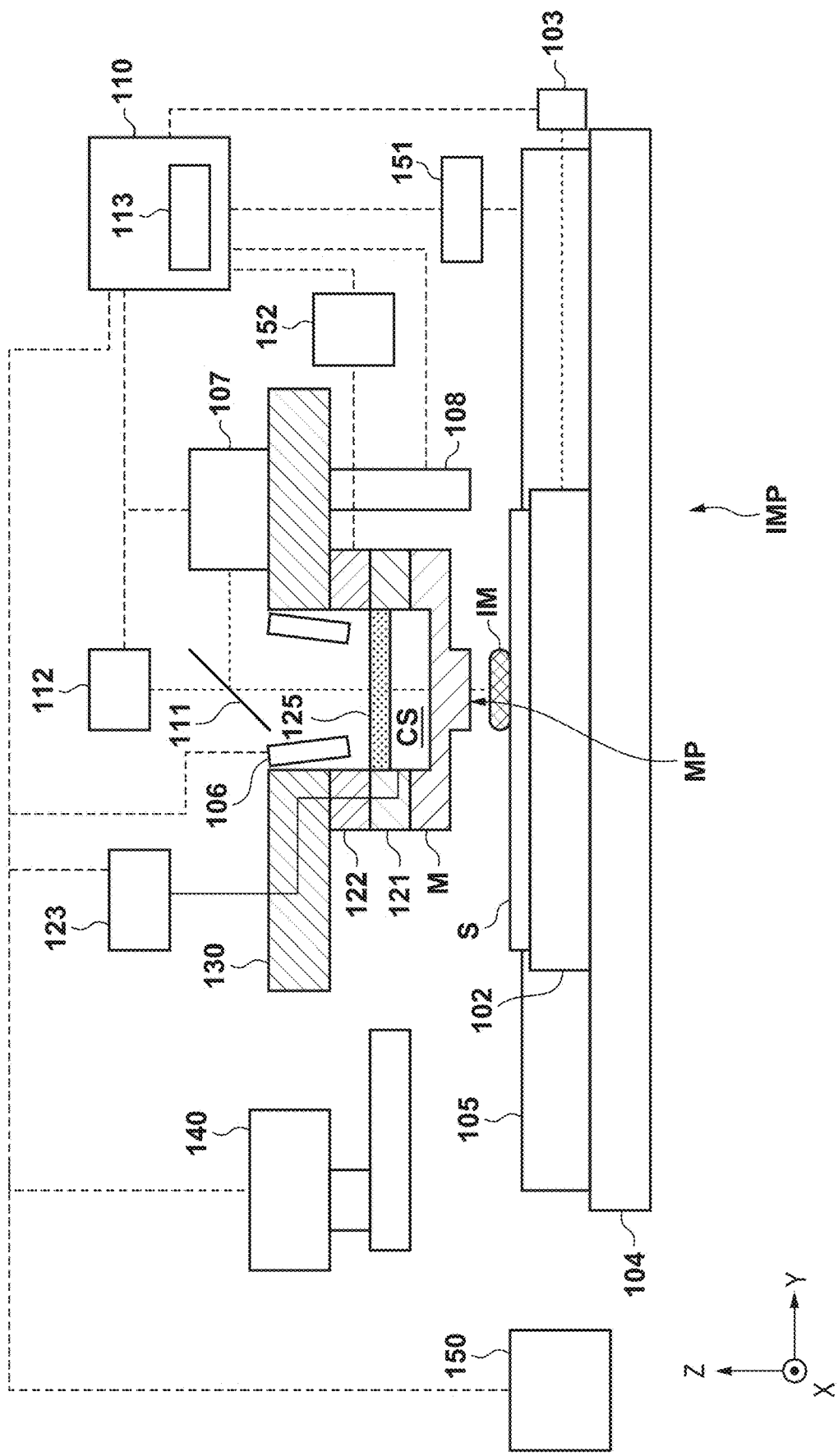
FIGS. 2A and 2B are views exemplarily showing the arrangement of the imprint apparatus.

FIG. 2A schematically shows the arrangement of an imprint apparatus IMP according to the first embodiment. The imprint apparatus IMP performs an imprint process in which an imprint material IM is cured in a state in which the imprint material IM on a shot region of a substrate S and a pattern region MP of a mold M are in contact with each other, and a cured product of the imprint material IM and the mold M are subsequently separated from each other. A pattern made of a cured product of the imprint material IM is formed on the substrate S by this imprint process.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

In the specification and the accompanying drawings, directions will be indicated on an XYZ coordinate system in which a horizontal surface is defined as the X-Y plane. In general, the substrate S is placed on a substrate holder 102 such that the surface of the substrate S is parallel to the horizontal surface (X-Y plane). Therefore, in the following description, the directions orthogonal to each other in a plane along the surface of the substrate S are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively. A rotation about the X-axis, a rotation about the Y-axis, and a rotation about the Z-axis are indicated by θX, θY, and θZ, respectively. Positioning means controlling the position and/or the posture. Alignment can include controlling the position and/or the posture of at least one of a substrate and a mold.

The imprint apparatus IMP can include a substrate holder 102 that holds the substrate S, a substrate driving mechanism 105 that drives the substrate S by driving the substrate holder 102, a base 104 that supports the substrate holder 102, and a position measuring device 103 that measures the position of the substrate holder 102. The substrate driving mechanism 105 can include, for example, a motor such as a linear motor or the like. The imprint apparatus IMP can include a sensor 151 that detects a substrate driving force (alignment load) necessary for the substrate driving mechanism 105 to drive the substrate S (substrate holder 102) during alignment. The substrate driving force required in an alignment operation, which is performed in a state in which the imprint material IM on the substrate S and the pattern region MP of the mold M are in contact with each other, corresponds to a shearing force that acts between the substrate S and the mold M. The shearing force is mainly a force that acts on the substrate S and the mold M in a plane direction. The substrate driving force required during alignment is, for example, correlated to the magnitude of a current supplied to the motor of the substrate driving mechanism 105 during alignment, and the sensor 151 can detect the substrate driving force based on the magnitude of the current. The sensor 151 is an example of a sensor for measuring the influence (shearing force) received by the mold M during pattern formation. In addition, a driving request (command value) output from a controller 110 (to be described later) to the substrate driving mechanism 105 will be referred to as a stage control value.

The imprint apparatus IMP can include a mold holder 121 that holds the mold M, a mold driving mechanism 122 that drives the mold M by driving the mold holder 121, and a support structure 130 that supports the mold driving mechanism 122. The mold driving mechanism 122 can include, for example, a motor such as a voice coil motor or the like. The imprint apparatus IMP can include a sensor 152 that measures a mold releasing force (separation load) and/or a pressing force. A mold releasing force is a force necessary for separating the cured product of the imprint material IM on the substrate S and the mold M from each other. A pressing force is a force for pressing the mold M to make the mold M contact the imprint material IM on the substrate S. The mold releasing force and the pressing force are forces that mainly act on a direction perpendicular to a plane direction of the substrate S and the mold M. The mold releasing force and the pressing force are, for example, correlated to the magnitude of a current supplied to the motor of the mold driving mechanism 122, and the sensor 152 can measure the mold releasing force and the pressing force based on the magnitude of the current. The sensor 152 is an example of a sensor for measuring the influence(s) (the mold releasing force and/or the pressing force) received by the mold M during the pattern formation. In addition, a driving request (command value) output from the controller 110 (to be described later) to the mold driving mechanism 122 will also be referred to as a stage control value.

The substrate driving mechanism 105 and the mold driving mechanism 122 form a driving mechanism for adjusting a relative position and a relative posture between the substrate S and the mold M. The adjustment of the relative position between the substrate S and the mold M by the driving mechanism includes a driving operation to bring the mold into contact with the imprint material on the substrate S and a driving operation to separate the mold from the cured imprint material (a pattern made of the cured product). The substrate driving mechanism 105 can be a driving mechanism having a plurality of degrees of freedom (for example, three axes including the X-axis, Y-axis, and θZ-axis, and preferably six axes including the X-axis, Y-axis, Z-axis, θX-axis, θY-axis, and θZ-axis). The mold driving mechanism 122 can also be a driving mechanism having a plurality of degrees of freedom (for example, three axes including the Z-axis, θX-axis, and θY-axis, and preferably six axes including the X-axis, Y-axis, Z-axis, θX-axis, θY-axis, and θZ-axis).

The imprint apparatus IMP can include a mold cleaner 150 and a mold conveyance mechanism 140 for conveying the mold M. The mold conveyance mechanism 140 can be configured, for example, to convey the mold M to the mold holder 121 and to convey the mold M from the mold holder 121 to an original stocker (not shown) or the mold cleaner 150. The mold cleaner 150 will clean the mold M by using ultraviolet light, a chemical solution, and the like.

Figure 2B:
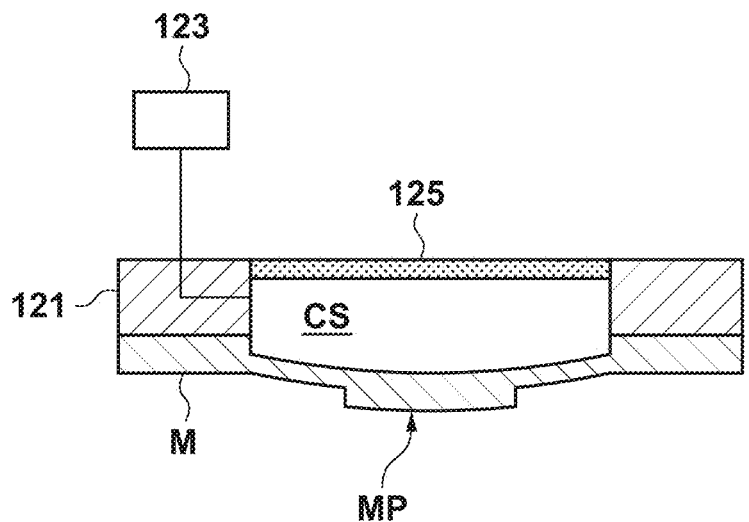

The mold holder 121 can include a window member 125 that forms a pressure controlled space CS on the side of a reverse surface (a surface on a side opposite to the pattern region MP on which the pattern to be transferred to the substrate S is formed) of the mold M. The imprint apparatus IMP can include a deforming mechanism 123 that controls the pressure (to be referred to as a cavity pressure hereinafter) of the pressure controlled space CS to deform the pattern region MP of the mold M into a convex shape toward the substrate S as schematically shown in FIG. 2B. In addition, the imprint apparatus IMP can include an alignment scope 106, a curing device 107, an image capturing device 112, and an optical member 111.

The imprint apparatus IMP can include the alignment scope 106. The alignment scope may be called an alignment measurement apparatus. The alignment scope 106 can generate image data by illuminating an alignment mark (to be also simply referred to as a "mark" hereinafter) on the substrate S (first member) and an alignment mark on the mold M (second member) and capturing optical images formed by the two alignment marks. The alignment scope 106 or the controller 110 can detect the information of the relative position between the marks by processing the image data obtained by image capturing. The alignment scope 106 can be aligned by a driving mechanism (not shown) in accordance with the position of an alignment mark to be observed. The image data generated by image capturing using the alignment scope 106 will also be referred to as an alignment image hereinafter. In addition, the measurement result obtained by the alignment scope 106 will also be referred to as an alignment measurement value.

An example of the alignment image observed with the alignment scope 106 can be the image data generated by capturing the optical images formed by reflected light from the first and second marks. Another example of the alignment image can be the image data generated by capturing moiré fringes (interference fringes) as the optical image formed by the first and second marks.

The curing device 107 irradiates the imprint material IM with an energy (for example, light such as ultraviolet light) for curing the imprint material IM via the optical member 111, and cures the imprint material IM with this energy. The image capturing device 112 captures images of the substrate S, the mold M, and the imprint material IM via the optical member 111 and the window member 125. The image data obtained by image capturing by the image capturing device 112 will also be referred to as a spread image hereinafter.

The imprint apparatus IMP can include a dispenser 108 for arranging the imprint material IM on the substrate S. The dispenser 108 discharges the imprint material IM so that the imprint material IM will be arranged on the substrate S in accordance with, for example, a drop recipe which indicates the arrangement of the imprint material IM. The imprint apparatus IMP can include the controller 110 for controlling the substrate driving mechanism 105, the mold driving mechanism 122, the deforming mechanism 123, the mold conveyance mechanism 140, the mold cleaner 150, the alignment scope 106, the curing device 107, the image capturing device 112, and the dispenser 108. In this embodiment, the controller 110 can include a processor that executes image processing for the image generated by the alignment scope 106 and a memory. The memory stores programs for executing control on the respective devices, a program for executing image processing, and various types of data. The controller 110 can be formed by, for example, a PLD (Programmable Logic Device) such as an FPGA (Field Programmable Gate Array), an ASIC (Application Specific Integrated Circuit), a general-purpose computer embedded with a program 113 or a combination of all or some of these components.

Figure 3:
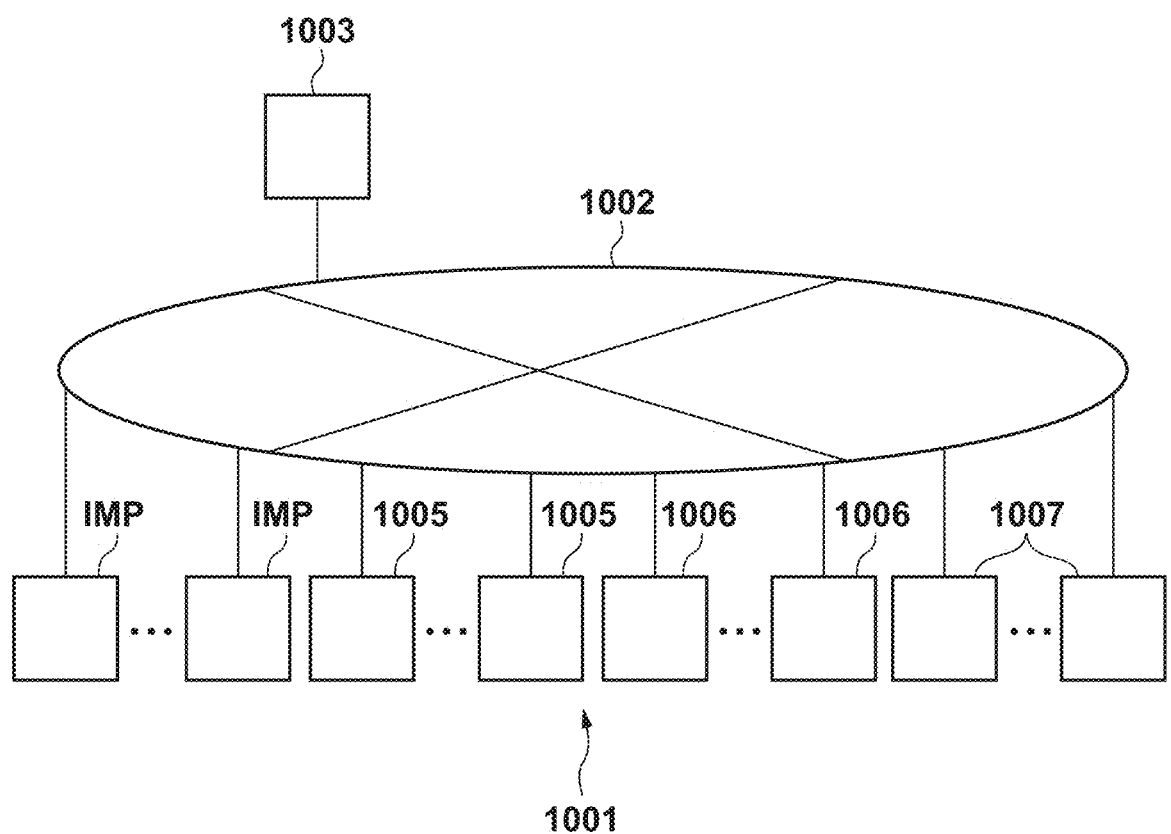
FIG. 3 is a view exemplarily showing the arrangement of an article manufacturing system.

FIG. 3 shows an example of the arrangement of an article manufacturing system 1001 for manufacturing an article such as a semiconductor device. The article manufacturing system 1001 can include, for example, one or a plurality of lithography apparatuses (the imprint apparatus IMP and/or an exposure apparatus). The article manufacturing system 1001 can also include one or a plurality of inspection apparatuses 1005 (for example, an overlay inspection apparatus and/or a foreign substance inspection apparatus), and one or a plurality of processing apparatuses 1006 (an etching apparatus and/or a deposition apparatus). Furthermore, the article manufacturing system 1001 can include an error amount calculation apparatus 1007 for calculating an alignment error amount. These apparatuses can be connected to a control device 1003, as an external systems, via a network 1002, and be controlled by the control device 1003. An MES, an EEC, or the like is an example of the control device 1003. Each error amount calculation apparatus 1007 can be formed by, for example, a PLD such as an FPGA, an ASIC, a general-purpose computer embedded with a program or a combination of all or some of these components. The error amount calculation apparatus 1007 can be, for example, a server called an edge server. For another example, the error amount calculation apparatus 1007 may also be incorporated in the control device 1003 or a controller of the imprint apparatus IMP or an exposure apparatus. The system including lithography apparatuses such as the imprint apparatus IMP and the exposure apparatus and the error amount calculation apparatus 1007 can be understood to be a lithography system.

The alignment scope 106 and the controller (processor) 110 of the imprint apparatus IMP can form a measurement apparatus for measuring or detecting the position information of a measurement target. In another point of view, the imprint apparatus IMP includes a measurement apparatus for measuring or detecting the position information of a measurement target. The measurement apparatus can measure, for example, the position information of a measurement target in a diffraction direction of a diffracting grating forming each alignment mark, that is, a first direction as a measurement direction. Furthermore, the measurement apparatus can be formed to measure the position information of the measurement target in the second direction (non-measurement direction) different from the first direction (for example, a direction perpendicular to the first direction). The processor can determine position information by obtaining the provisional position information of the measurement target based on image data, further obtaining a correction value related to alignment, and correcting the provisional position information with the correction value. The measurement apparatus can further include a model for obtaining a correction value based on a feature value. In addition, the measurement apparatus can further include a machine learning device that generates the model by machine learning.

A lithography method can include a measurement method for measuring the position information of a measurement target, a measurement method for measuring an alignment error between a shot region of a substrate and a mold, and an alignment method for aligning the shot region of the substrate and the mold. The lithography method will obtain, from the image data of an inspection target, an alignment error amount as a correction value. The inspection target here can be (an optical image of) a mark or an optical image (for example, moiré fringes) formed by the first mark and the second mark.

FIG. 1 shows, as an embodiment of a lithography method, a lithography method to be executed in an imprint system including an imprint apparatus IMP. A controller 110 can control the operation shown in FIG. 1.

In step S101, a substrate conveyance mechanism (not shown) will convey a substrate S from a conveyance source (for example, a relay portion between a preprocessing apparatus and the imprint apparatus IMP) to a substrate holder 102. In steps S102 to S106, an imprint process (pattern formation) is executed on a shot region selected from a plurality of shot regions of the substrate S. In step S102, the dispenser 108 arranges the imprint material IM on a shot region as an imprint target of the plurality of shot regions of the substrate S. This process can be performed by causing the dispenser 108 to discharge the imprint material IM while driving the substrate S by the substrate driving mechanism 105.

In step S103, the substrate S and the mold M are driven relatively by at least one of the substrate driving mechanism 105 and the mold driving mechanism 122 so that the pattern region MP of the mold M will contact the imprint material IM on the shot region as an imprint target. In one example, the mold driving mechanism 122 will drive the mold M so that the pattern region MP of the mold M will contact the imprint material IM on the shot region as an imprint target. In the process of bringing the pattern region MP of the mold M into contact with the imprint material IM, the deforming mechanism 123 can deform the pattern region MP of the mold M into a convex shape toward the substrate S. At this time, a cavity pressure can be controlled and its value can be accumulated. In addition, an image capturing device 112 will execute image capturing in the process of bringing the pattern region MP of the mold M into contact with the imprint material IM, and a captured image (spread image) can be accumulated.

In step S104, the shot region of the substrate S and the pattern region MP of the mold M can be aligned. The alignment can be performed by using the alignment scope 106 to measure the relative position between the alignment mark of the shot region and the alignment mark of the mold M so that the relative position will fall within a tolerance range of a target relative position. In the alignment, the substrate S and the mold M can be driven relatively by at least one of the substrate driving mechanism 105 and the mold driving mechanism 122. Alignment uses alignment correction to be described later. For example, the target driving amounts of an alignment mark on a shot region and an alignment mark on the mold M are determined based on the alignment mark positions measured from the alignment mark images and the alignment error amounts calculated by the alignment error amount calculation method. Such an alignment error amount may be reflected in a target relative position at all measurement relative positions during alignment or may be reflected in a relative position only in the last stage where the relative position falls within the range of distances equal to or less than a preset distance. A learned model used for the calculation of alignment error amounts is obtained in advance by the error amount calculation apparatus or the like. In addition, when an abnormality in an alignment error amount is detected, the processing to be described later can be performed separately. In order to calculate a model for the calculation of an alignment error amount by the error amount calculation apparatus, the observation images of the alignment mark images in step S104 or data obtained from the observation images are accumulated and transmitted to the error amount calculation apparatus.

Figure 4A:
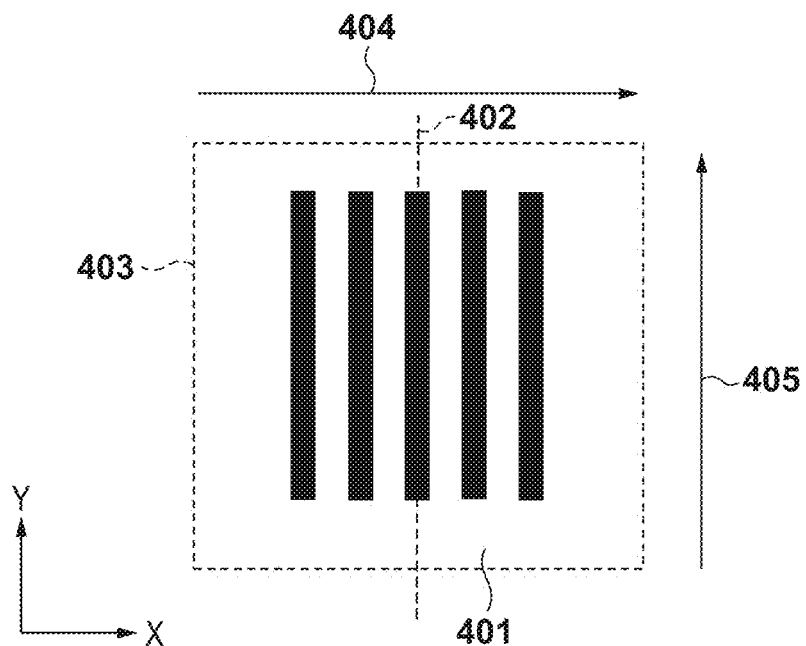
FIGS. 4A and 4B are views exemplarily showing an alignment mark image and an alignment waveform.
Figure 4B:
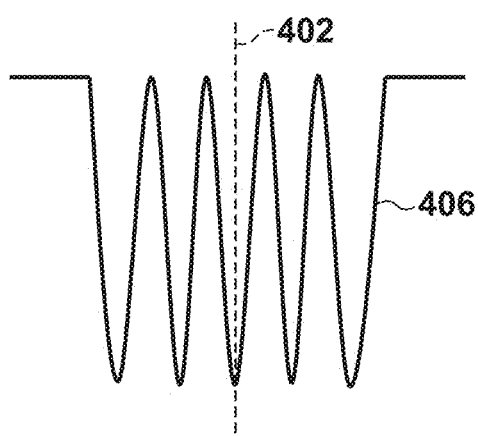

An example of a method of measuring the positions of alignment marks will be described below. FIG. 4A shows an alignment mark image 401 for the measurement of a position in the X direction. FIG. 4B shows an alignment waveform 406 obtained from the alignment mark image 401. The substrate S can have an alignment mark for generating the alignment mark image in FIG. 4A and an alignment mark for measuring the position of the alignment mark in the Y direction upon rotation of the mark through 90°.

The mold M also has two types of alignment marks. In step S104, alignment mark positions 402 are measured to calculate the relative positions (in the X and Y directions) of the substrate S and the mold M. Alternatively, diffraction gratins may be formed as alignment marks on the substrate S and the mold M, and moiré fringes as interference fringes generated by overlaying the marks may be observed as an alignment mark image. In this example, the alignment scope 106 can be formed by a simple optical system.

Figure 5:
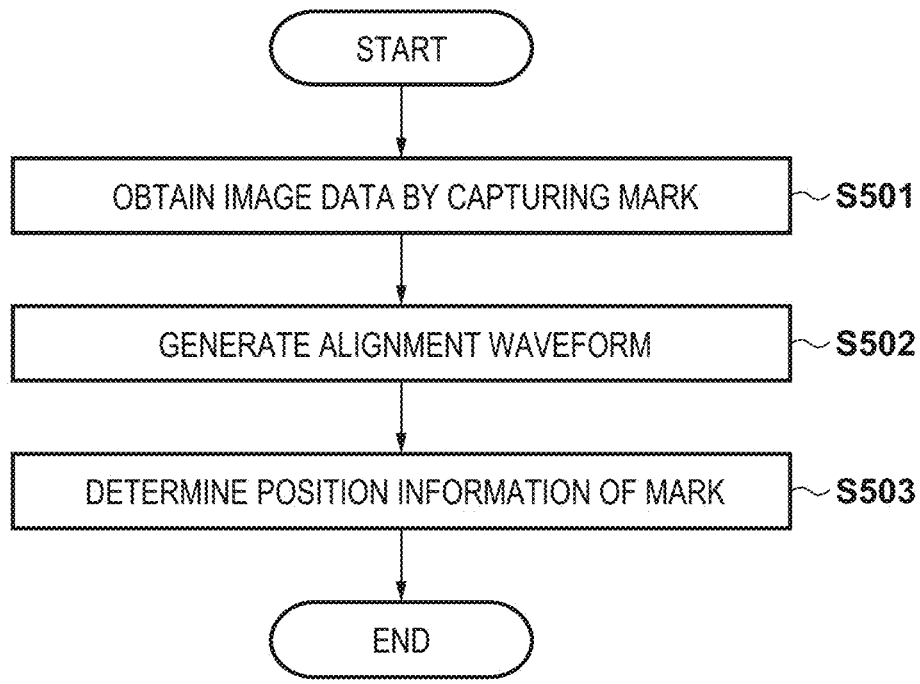
FIG. 5 is a flowchart exemplarily showing a method of calculating the position of an alignment mark.

FIG. 5 shows an example of a method of calculating the position of an alignment mark by using the alignment scope 106. A method of measuring the alignment mark position 402 will be described as an example of the alignment mark image 401 in FIG. 4A. The alignment mark position 402 is the central position of the alignment mark image in the measurement direction of the alignment mark (the X direction in the case in FIG. 4A). In this case, a measurement direction 404 is the X direction, and a non-measurement direction 405 is the Y direction.

In step S501, the controller 110 obtains the alignment mark image 401 by capturing an image of the alignment mark using the alignment scope 106. In step S502, the controller 110 generates (calculates) the alignment waveform 406 based on the alignment mark image 401. For example, of a plurality of pixels constituting a measurement region 403 of the alignment mark image 401 obtained as a digital image, pixel values in the non-measurement direction 405 (Y direction) at the respective positions in the measurement direction 404 (X direction) are integrated. This generates the alignment waveform 406.

In step S503, the controller 110 calculates the alignment mark position 402 based on the alignment waveform 406. As an example of a calculation method, there is available a method of calculating the gravity center position of the alignment waveform 406 as the alignment mark position 402. Other examples include a method of calculating an alignment mark position by calculating the phase of an alignment waveform using Fourier transform or the like and a method of calculating an alignment mark position by using a pattern matching method.

Returning the description to FIG. 1, in step S105, the curing device 107 will irradiate the imprint material IM, which is between the substrate S and the pattern region MP of the mold M, with energy for curing the imprint material IM. This will cure the imprint material IM and form a cured product of the imprint material IM. In step S106, the substrate S and the mold M are relatively driven by at least one of the substrate driving mechanism 105 and the mold driving mechanism 122 so that the cured product of the imprint material IM and the pattern region MP of the mold M are separated from each other. In one example, the mold M is driven by the mold driving mechanism 122 so as to separate the pattern region MP of the mold M from the cured product of the imprint material IM. The pattern region MP of the mold M can be deformed in a convex shape toward the substrate S also when the cured product of the imprint material IM and the pattern region MP of the mold M are to be separated from each other. In addition, the image capturing device 112 executes image capturing, and the state of separation between the imprint material IM and the mold M can be observed based on the captured image.

In step S107, the controller 110 determines whether the imprint process from step S102 to step S106 has been performed on all of the shot regions of the substrate S. If it is determined that the imprint process from step S102 to step S106 has been performed on all of the shot regions of the substrate S, the controller 110 advances the process to step S108. If it is determined that an unprocessed shot region is present, the process returns to step S102. In this case, the imprint process from step S102 to step S106 is executed on a shot region selected from the unprocessed shot regions.

In step S108, the substrate conveyance mechanism (not shown) conveys the substrate S from the substrate holder 102 to a conveyance destination (for example, a relay portion to a post-processing apparatus). In a case in which a lot formed by a plurality of substrates is to be processed, the operation shown in FIG. 1 will be executed on each of the plurality of substrates.

In order to accurately form a pattern on a shot region on a substrate, it is important for the imprint apparatus to reduce the alignment error between the pattern portion of the mold and the shot region. In this embodiment, the magnitude of an error in the alignment mark position calculated from an alignment mark image will be referred to as an "alignment error amount" (or simply an "error amount"). An alignment error amount can be obtained by, for example, obtaining the difference (A−B) between an alignment measurement value A and an overlay shift amount B obtained between an overlay inspection mark of an underlying layer of the substrate S and an overlay inspection mark of a layer formed above this underlying layer by the imprint apparatus IMP. An alignment mark position error can be caused by the calculation of the position from the inaccurate alignment waveform obtained by the occurrence of noise in the alignment mark image 401. Noise can be caused by various factors. Several specific examples related to the occurrence of such noise will be described below.

Figure 6A:
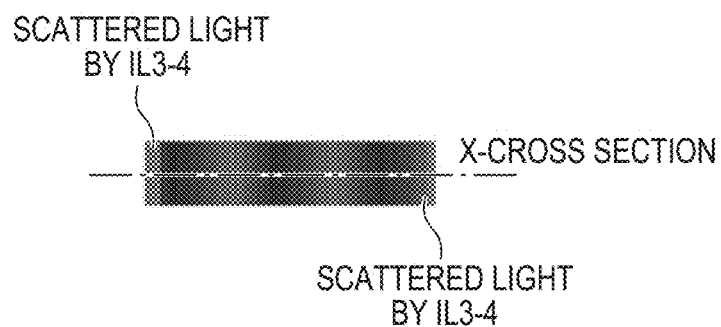
FIGS. 6A to 6D are views for explaining a moiré measurement system.
Figure 6B:
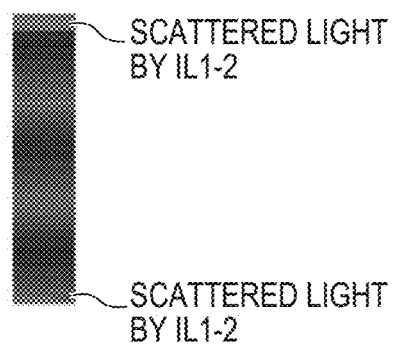
Figure 6C:
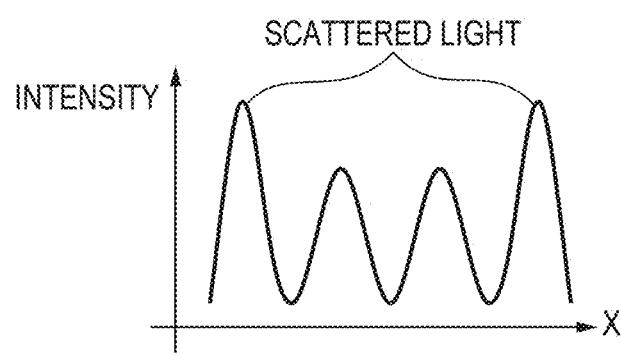
Figure 6D:
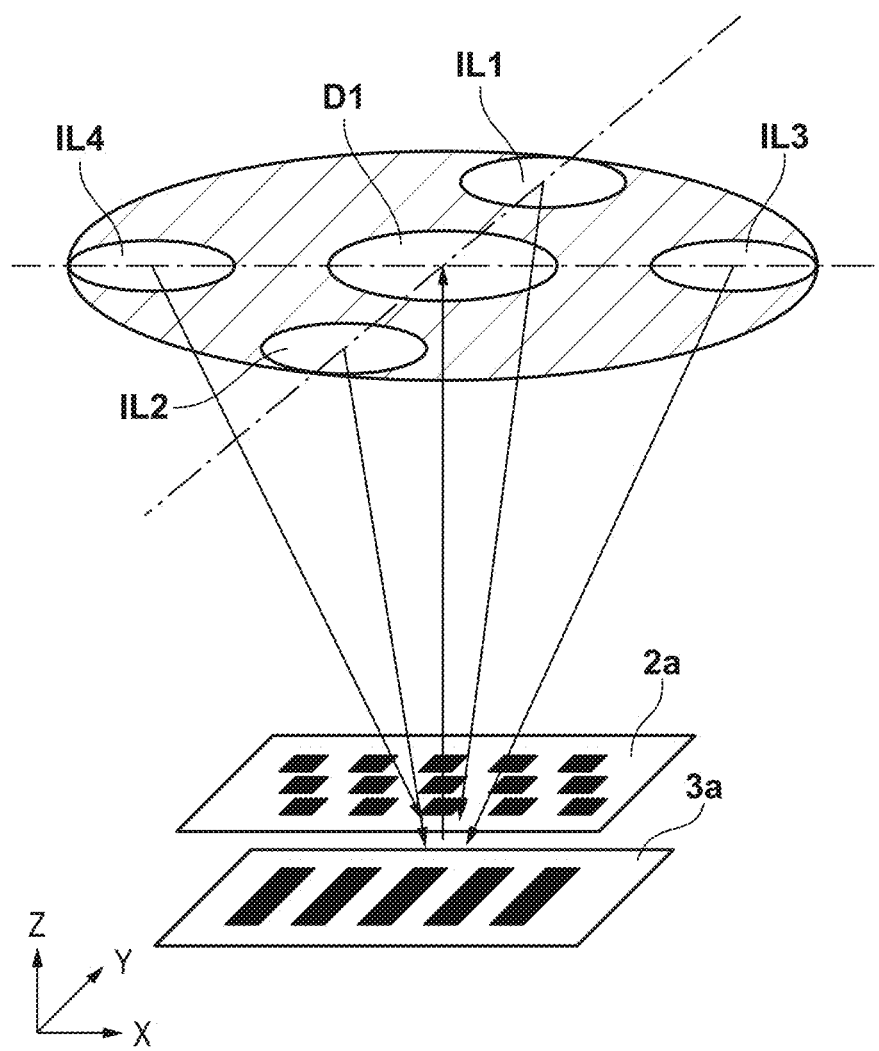

FIGS. 6A to 6D are conceptual views of the moiré measurement system. FIG. 6D shows the principle of measuring the relative position information between the shot region of the substrate S and the mold M based on the moiré fringes as an optical image formed by the first mark provided on the shot region of the substrate S and the second mark provided on the mold M. FIG. 6D shows a first mark 3a provided on the shot region of the substrate S and a second mark 2a provided on the mold M. The alignment scope 106 includes an illumination optical system that illuminates these marks, and the illumination optical system has a pupil plane P. Reference symbols IL1, IL2, IL3, and IL4 indicate rays of illumination light from poles formed on the pupil plane P.

The illumination light IL1 and the illumination light IL2 are used for the measurement of a relative position between the shot region of the substrate S and the mold M in the X direction. As exemplified in FIG. 6A, in the measurement of the relative position in the X direction, the illumination light IL3 and the illumination light IL4 which are not used in the measurement of the relative position in the X direction can become rays of scattered light by being scattered by the edges of the first mark 3a and the second mark 2a. Each ray of scattered light can become a flare and mix into a moiré fringe signal (moiré fringe image data). FIG. 6C shows an example of a signal intensity distribution (light intensity distribution on a light receiving surface of an image capturing element of the alignment scope 106) of the moiré fringe signal in the X direction in FIG. 6A. It can be seen that there are large peaks on the left end side and the right end side of the signal intensity distribution due to the influence of the rays of light scattered by the edges of the first mark 3a and the second mark 2a. Among the four cycles of the moiré fringe signal, the two cycles on the left end side and the right end side have received the influence of the scattered light, and the measurement accuracy of the relative position is influenced as a result. A similar phenomenon also occurs in the measurement of a relative position in the Y direction, and the illumination light IL1 and the illumination light IL2 which are not used in the measurement of the relative position in the Y direction can become rays of scattered light by being scattered by the edges of a first mark 3b and a second mark 2b. As a result, each ray of scattered light can become flare light and mix into the moiré fringe signal. Although the influence of flare light on the light intensity distribution in each measurement direction has been described above, the light intensity distribution in each non-measurement direction can also change due to receiving an influence from flare light. A change in the light distribution in the non-measurement direction can also degrade the measurement accuracy of a relative position or a position in the measurement direction.

Referring to FIGS. 7 and 8, reference symbols WA and WA' each show an example of a signal waveform obtained by calculating an integrated value of signal values of pixels whose positions in the measurement direction (X direction) are equal to each other among the plurality of pixels forming the image obtained by using the alignment scope 106. Each of the signal waveform WA in FIG. 7 and the signal waveform WA' in FIG. 8 can be understood to be a signal waveform in the measurement direction. Referring to FIGS. 7 and 8, reference symbols WB and WB' each show an example of a signal waveform obtained by calculating an integrated value of signal values of pixels whose positions in the non-measurement direction (Y direction) are equal to each other among the plurality of pixels forming the image obtained by using the alignment scope 106. Each of the signal waveform WB in FIG. 7 and the signal waveform WA' in FIG. 8 can be understood to be a signal waveform in the non-measurement direction. Compared to the signal waveforms WA and WB in FIG. 7, the waveforms WA' and WB' in FIG. 8 show a greater influence of flare light. The signal waveform WA' in the measurement direction exemplified in FIG. 8 has a greater distortion than the signal waveform WA in the measurement direction exemplified in FIG. 7. This can generate an error 901 in the measurement result in the measurement direction. In addition, the signal waveform WB' in the non-measurement direction exemplified in FIG. 8 has a greater distortion than the signal waveform WB in the non-measurement direction exemplified in FIG. 7. This indicates that there is greater variation in the signal value. In other words, it can be seen that the signal waveform in the non-measurement direction is correlated to the signal waveform in the measurement direction, that is, the measurement result in the measurement direction. Hence, the position information of a measurement target can be accurately determined by obtaining a feature value of the image data related to the non-measurement direction and correcting, based on this feature value, the provisional position information of the measurement target in the measurement direction which is obtained from the image data.

Figure 9A:
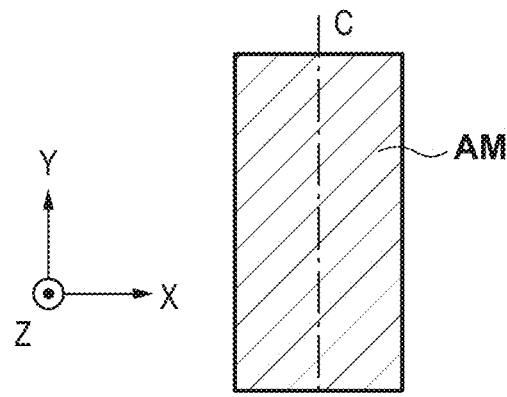
FIGS. 9A to 9C are views exemplarily showing the asymmetry of an alignment mark.
Figure 9B:
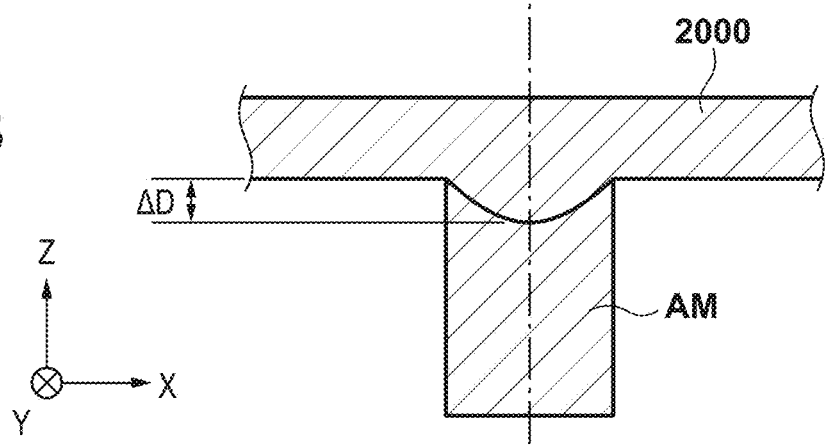
Figure 9C:
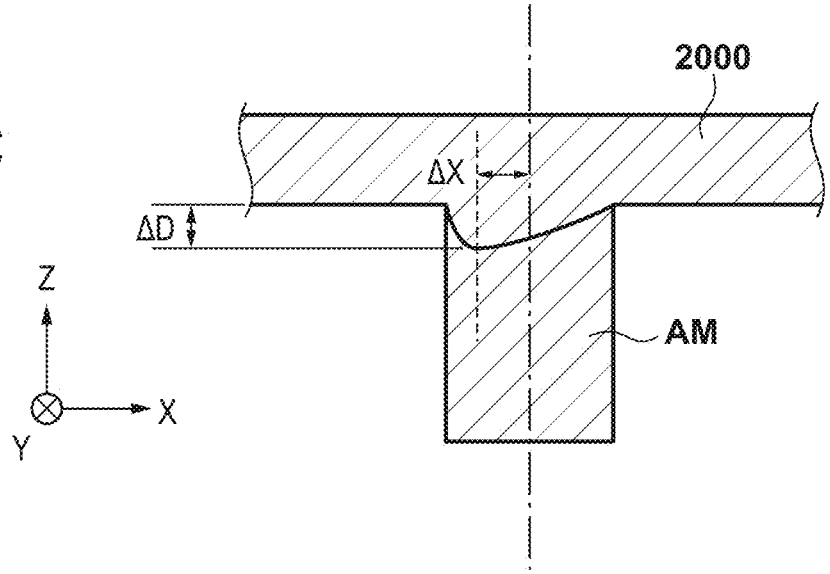

An example of the relationship between the optical parameters, stepped structure, and alignment accuracy of the alignment scope 106 will be described with reference to FIGS. 9A to 9C and FIGS. 10A to 10C. FIG. 9A is a plan view of an example of an alignment mark AM viewed from the Z direction. The measurement direction is the X direction. In this case, the alignment mark AM is represented as one mark extending in the Y direction. FIGS. 9B and 9C are sectional views each taken along the X-Z plane of the alignment mark AM. The alignment mark AM can have a structure having a metal material such as tungsten embedded in an insulating material such as $SiO_2$. The upper portion of the alignment mark AM is coated with a resist 2000 as a photosensitive material. An alignment mark image can be captured by irradiating this alignment mark with light and obtaining reflected light.

In a semiconductor process, chemical mechanical polishing (CMP) is sometimes used as a technique of planarizing a substrate surface. In this case, the shape of the alignment mark AM can change microscopically when it is polished. FIG. 9B shows a state in which the surface of the alignment mark AM is polished (dished) into an ideal shape. In this case, the alignment mark AM is polished into a shape symmetrical about a central line C extending in the Y direction. However, in an actual CMP process, the shape of an alignment mark sometimes deviates from an ideal state depending on polishing conditions (a polishing direction, a polishing material, and the like). FIG. 9C shows a state in which the polished state of the alignment mark deviates from the ideal state. In this case, the alignment mark is polished asymmetrically about the central line C, so that the lowest position deviates from the center in the X direction by ΔX.

Figure 10A:
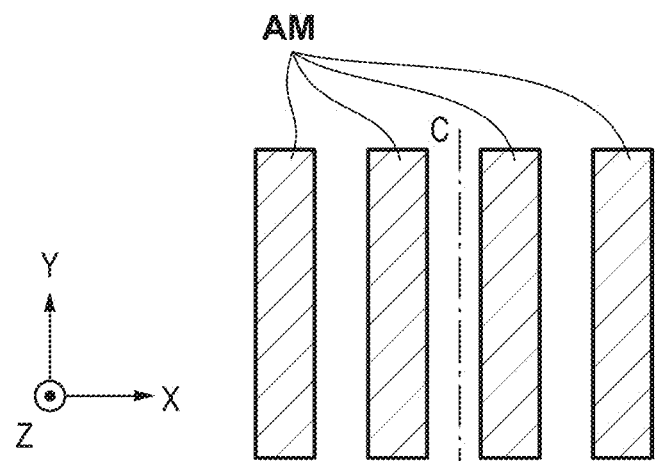
FIGS. 10A to 10C are views exemplarily showing the asymmetry of a plurality of alignment marks.
Figure 10B:
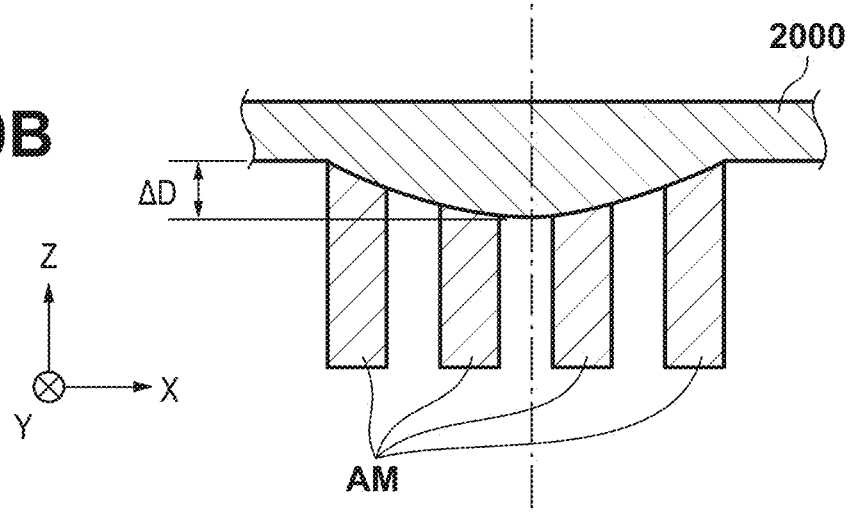
Figure 10C:
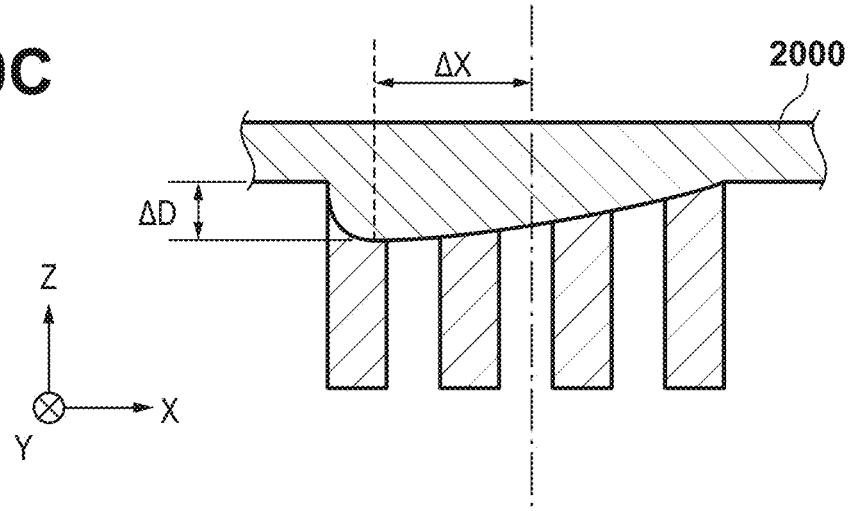

FIG. 10A is a plan view of another example of the alignment mark AM viewed from the Z direction. Although the alignment mark AM in FIG. 9A is one mark extending in the Y direction, the alignment marks AM in FIG. 10A are a plurality of marks extending in the Y direction. In the case shown in FIG. 10A, the alignment marks AM are four marks extending in the Y direction. FIGS. 10B and 10C are sectional views each taken along the X-Z plane of the alignment mark AM like FIGS. 9B and 9C. In the cases shown in FIGS. 10B and 10C, in addition to the above dishing phenomenon, non-mark portions (between the marks) are also polished (subjected to so-called erosion). FIG. 10B shows a case in which such phenomena have occurred symmetrically about the central line C extending in the Y direction so as to pass through the center of the fourth marks in the X direction. FIG. 10C shows a state in which erosion has occurred asymmetrically about the central line C. The amount of occurrence of erosion phenomenon can change depending on the density (for example, the linewidth or pitch), material, polishing conditions (for example, a polishing direction and a polishing material), and the like of the plurality of alignment marks AM.

Noise is overlaid on an alignment mark image due to various factors in this manner. This can cause an alignment error. On the other hand, all types of noise do not always cause an error. There are some types of noise that tend to cause errors and some types of noise that do not tend to cause errors. This phenomenon occurs due to the characteristics of the mechanism and processing devices of the apparatus and processing methods. One of such characteristics is the characteristic of the measurement method.

In contrast to this, for example, there may be a measurement method of converting an alignment waveform into the amplitude and phase values of each frequency by frequency analysis such as Fourier transform and calculating a mark position based on only the phase of a specific frequency. Such a method is robust against noise other than measurement frequency noise but sometimes sensitively responds to even small measurement frequency noise that cannot be visually recognized.

Specifying only noise that influences an alignment error among various types of noise can efficiently improve the alignment accuracy. For example, it is possible to correct alignment errors in accordance with the magnitude of specific noise and improve adjustment work, monitoring, replacement, and design of a mechanism, processing devices, and processes which cause alignment errors.

Figure 11:
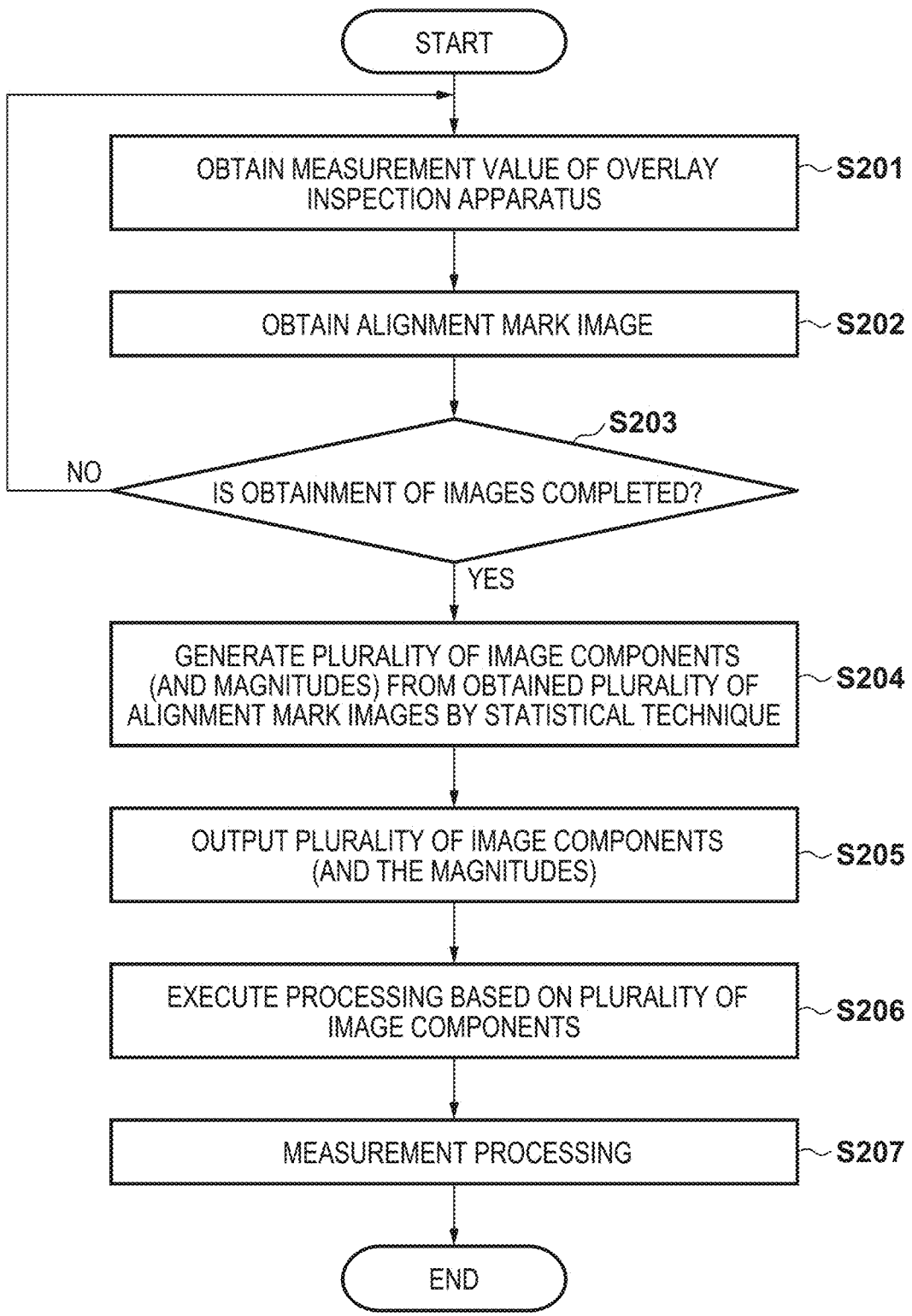
FIG. 11 is a flowchart exemplarily showing processing for an alignment image.

A process for an alignment image according to this embodiment will be described with reference to FIGS. 11 and 12.

Figure 12:
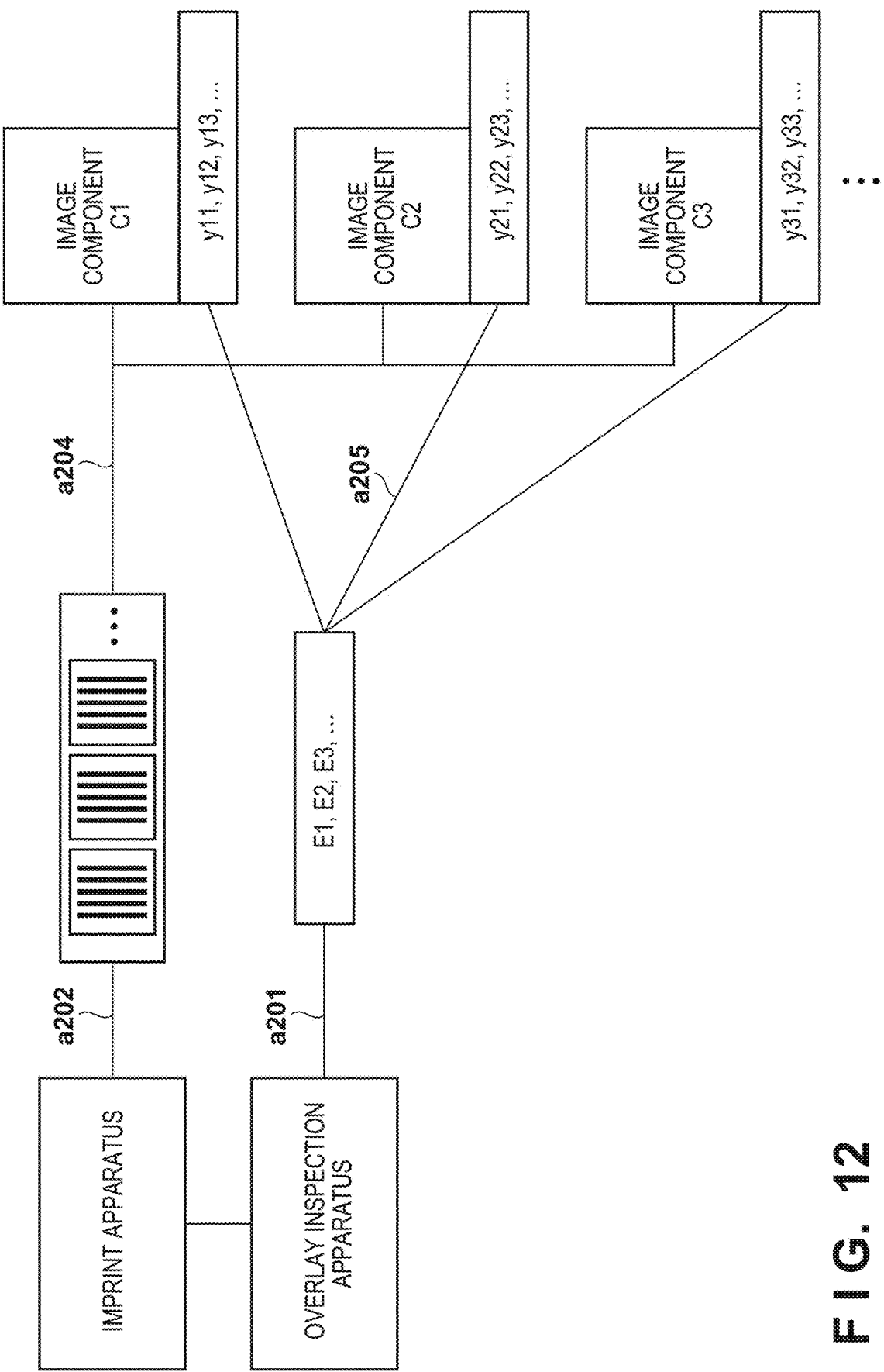
FIG. 12 is a view for explaining processing for an alignment image.

In step S201, the controller 110 obtains a measurement value of one shot region of the substrate S measured by the overlay inspection apparatus (a201 in FIG. 12). The information obtained in this case is a result obtained by measuring the overlay accuracy of at least one point belonging to each shot region of the substrate. The measurement value is, for example, an overlay shift amount obtained between (an overlay inspection mark of) an underlying layer of the substrate and (an overlay inspection mark of) of an imprinted layer. An alignment error amount is obtained by calculating a difference between the measurement value obtained by the overlay inspection apparatus and the final measurement value obtained by the imprint apparatus (the relative position between the alignment mark on the shot region and the alignment mark on the mold M).

In step S202, the controller 110 obtains the image data of the alignment mark image on one short region of the substrate S measured by the overlay inspection apparatus (a202 in FIG. 12). The alignment mark image is the one obtained in step S104 described above and can be transmitted from the imprint apparatus to the error amount calculation apparatus at an arbitrary timing after step S104.

In this case, it is planned to obtain a plurality of alignment mark images different in measurement target alignment mark and/or measurement condition and corresponding alignment error amounts. In step S203, the controller 110 determines whether the planned obtaining of image data is completed. If there is any image data to be obtained, the process returns to step S201 to repeat the process to obtain the remaining image data. If the planned obtaining of image data is completed, the process advances to step S203. The above "plurality of different alignment mark images" can be alignment mark images on a plurality of substrates but are not limited to them. The above "plurality of different alignment mark images" may be, for example, images of alignment marks on different shot regions on one substrate or images of alignment marks existing at different coordinates on one shot region. In addition, the above "plurality of different alignment mark images" may be obtained by performing image capturing and position measurement of alignment marks under a plurality of measurement conditions different in light amount and wavelength. Alternatively, the above "plurality of different alignment mark images" may be obtained at arbitrary timings in an imprint sequence. Such timings may include, for example, times immediately before or after curing of an imprint material. Since the substrate S to be measured by an external overlay inspection apparatus is in a state in which the imprint material is cured, using the substrate after the imprint material is cured can remove variations caused when the imprint material is cured.

An alignment mark image group $(X_1, X_2, X_3, \ldots, X_n)$ (where n is the number of images obtained) and error amounts $(E_1, E_2, E_3, \ldots, E_n)$ are obtained through this process. In this case, an image of an alignment mark with a width w [pixel] and a height h [pixel] is represented by a vector having each pixel value such as $X=(x_{11}, x_{12}, \ldots, x_{hw})$ as one element.

In step S204, the controller 110 generates a plurality of image components (and information indicating their magnitudes) from all the obtained alignment mark images by using a statistical technique (a204 in FIG. 12). An image component can include a characteristic component (a signal, regular noise, or the like) in the image. Principal component analysis is an example of the statistical technique. Other examples of the statistical technique include a statistical analysis technique using a plurality of data, such as autoencoder or independent component analysis, and a dimensionality reduction technique. A method of generating a plurality of image components by using principal component analysis will be described below. Using principal component analysis will convert an alignment mark image group in the following manner.

$$(X_1, X_2, X_3, \ldots, X_n) = C_1(y_{11}, y_{12}, y_{13}, \ldots, y_{1n}) + C_2(y_{21}, y_{22}, y_{23}, \ldots, y_{2n}) + C_3(y_{31}, y_{32}, y_{33}, \ldots, y_{3n}) + \ldots + C_m(y_{m1}, y_{m2}, y_{m3}, \ldots, y_{mn})$$

In this case, $C_1, C_2, C_3, \ldots, C_m$ are vectors having the same magnitudes as $X_1, X_2, X_3, \ldots, X_n$ and can be handled as images, $C_1, C_2, C_3, \ldots, C_m$ are perpendicular to each other, and $y_{11}, y_{12}, y_{13}, \ldots$ are scalar values.

The above formula represents that $X_p$ is decomposed into an image component $C_q$ and a magnitude $y_{qp}$ of the image component. If there are several noise components in an alignment mark image, each noise component is expected to appear as one of the image components $C_1, C_2, C_3, \ldots, C_m$. In this case, m represents the number of decomposed image components, n is the maximum value, and p and q are arbitrary numbers.

In principal component analysis, as q increases, the variance of magnitudes $(y_{q1}, y_{q2}, y_{q3}, \ldots, y_{qn})$ of image components decreases, and the information amount of $y_{qp}$ decreases. In addition, image components can be obtained in sequence from the image component $C_1$. If it is determined that the information amount is so small that it is not necessary to derive the correlation described below, the calculation of $C_q$ may be stopped halfway.

In step S205, the controller 110 outputs a plurality of generated image components (and information indicating their magnitudes). The output data may be stored in the memory in the controller or an external storage device and/or displayed by a display device (not shown). In step S206, processing based on a plurality of output image components is performed. The processing based on the plurality of image components can include work to specify noise that has caused an alignment error based on the data displayed by the user.

Alternatively, the processing based on the plurality of image components can include the processing executed by the controller 110 to specify noise that has caused an alignment error. A specific example related to the contents of such processing will be described below.

The controller 110 obtains the correlation between the magnitude of each of a plurality of image components and a value related to a measurement error. More specifically, the controller 110 calculates correlation coefficients between image component magnitudes $(y_{q1}, y_{q2}, y_{q3}, \ldots, y_{qn})$ and error amounts $(E_1, E_2, E_3, \ldots, E_n)$ corresponding to the respective magnitudes, which are values related to measurement errors (a205 in FIG. 12). Thereafter, the controller 110 can perform the processing of evaluating the influences of the respective image components on the measurement errors based on the obtained correlation coefficients. For example, the controller 110 can specify the image component $C_q$ having a correlation coefficient higher than a predetermined value (for example, 0.6) as a noise component (which has caused an alignment error) that influences the measurement error.

Alternatively, the controller 110 may obtain the multiple correlation coefficient between the magnitude of a combination of several image components $(C_q, C_r, \ldots)$ and the error amount. The controller 110 may then obtain a combination of image components whose coefficient is higher than the predetermined value and specify an image component included in the combination as a noise component that has a large influence on a measurement error.

In the above case, the controller 110 obtains an error amount by using the overlay inspection apparatus and specifies a noise component that has caused an alignment error based on the error amount. Alternatively, it is possible to obtain an error amount from apparatus data such as an alignment measurement value and specify a noise component that has caused an alignment error based on the error amount.

The above case has exemplified the technique of generating a plurality of image components by principal component analysis on an alignment mark image. Alternatively, a plurality of signal waveform components may be generated by applying a statistical technique such as principal component analysis to the signal waveform obtained from an alignment mark image (the alignment waveform 406 in FIG. 4B).

The above case has also exemplified the operation of obtaining measurement values on all the shot regions using the overlay inspection apparatus and performing principal component analysis from the obtained data. However, the present invention is not limited to this. For example, a semiconductor exposure apparatus or imprint apparatus uses a so-called global alignment scheme of performing alignment measurement on a predetermined number of alignment sample shots of a plurality of shot regions on a substrate and obtaining shot array information (including linear components and high-order components) by statistical processing for the measurement result. In addition, in order to improve the productivity, the overlay inspection apparatus often performs measurement on a predetermined number of inspection sample shot regions instead of all the shot regions on the substrate. Furthermore, the above alignment sample shot regions do not often coincide with inspection sample shot regions. For this reason, it is not possible to obtain data indicating one-to-one relationship between the above alignment images and the measurement values obtained by the overlay inspection apparatus. In such a case, however, a shot array on the entire substrate may be calculated from a measurement result on inspection sample shot regions, and predicted values of the measurement values obtained by the overlay inspection apparatus on alignment sample shot regions may be calculated. This makes it possible to obtain data equivalent to the alignment mark image and the measurement values obtained by the overlay inspection apparatus. Accordingly, the above principal component analysis can be performed.

Steps S201 to S206 described above are preprocessing for specifying image components including noise components that influence measurement errors. After this preprocessing, in step S207, an image of a measurement target is captured by a scope, and the measurement processing of obtaining the position information of the measurement target is executed based on the processing result obtained based on the plurality of image components described above.

(Alignment Correction Method)

As described above, the controller 110 determines position information by obtaining provisional position information of the measurement target based on an obtained image and correcting the provisional position information with a correction value based on a value related to a measurement error (alignment error amount). A method of correcting alignment by using a specified noise component will be described below. This embodiment will exemplify a technique of generating a plurality of image components by principal component analysis, predicting an error amount from the magnitude of an image component having the highest correlation with the error amount by linear regression, and performing alignment correction based on the predicted error amount. As a technique of generating a plurality of image components, other techniques like those described above may be used. In addition, to predict an error amount, a regression technique based on machine learning using SVM, gradient boosting, a neural network, or the like may be used. In addition, an error amount may be predicted using a plurality of image components by, for example, selecting several components with high correlations or using a combination of image components which maximizes the multiple correlation coefficient.

For example, a model for obtaining a correction value based on the feature value of an image is generated. A procedure for the generation of this model is basically the same as that shown in FIG. 11 described above. $C_1$, $C_2$, $C_3$, ..., $C_m$ output in step S205 are saved in the memory. After step S205, the controller 110 provides the following regression formula with respect to ($y_{q1}$, $y_{q2}$, $y_{q3}$, ..., $y_{qn}$) of the component $C_q$ having the highest correction with the error amounts ($E_1$, $E_2$, $E_3$, ..., $E_n$):

$$(E'_1, E'_2, E'_3, \ldots, E'_n) = ax(y_{q1}, y_{q2}, y_{q3}, \ldots, y_{qn}) + b$$

The controller 110 then obtains a and b that minimize the error between E and E' by a least-squares method and saves the obtained value in the memory.

A model can be generated by, for example, making the error amount calculation apparatus 1007 function as a model generating apparatus and perform machine learning. The following is a specific example. First of all, the imprint apparatus IMP forms new layers (patterns) on a plurality of shot regions of a substrate under the same conditions. The external overlay inspection apparatus measures an overlay shift amount obtained between (an overlay inspection mark of) an underlying layer on each shot region and (an overlay inspection mark of) the newly formed layer. The error amount calculation apparatus 1007 then obtains the measured overlay shift amount of each shot region and calculates, as the alignment error amount, the difference between each overlay shift amount and the final measurement value obtained when a layer was newly formed on the shot region. Thereafter, the model generation apparatus 1007 performs machine learning by using, as input data of the model, the feature value of the mark image of each shot region used when newly forming layer, and using the calculated alignment error amount as training data. At this time, if an abnormal value is present in the input data and/or the training data, it is preferable to perform machine learning by excluding this data.

Figure 13:
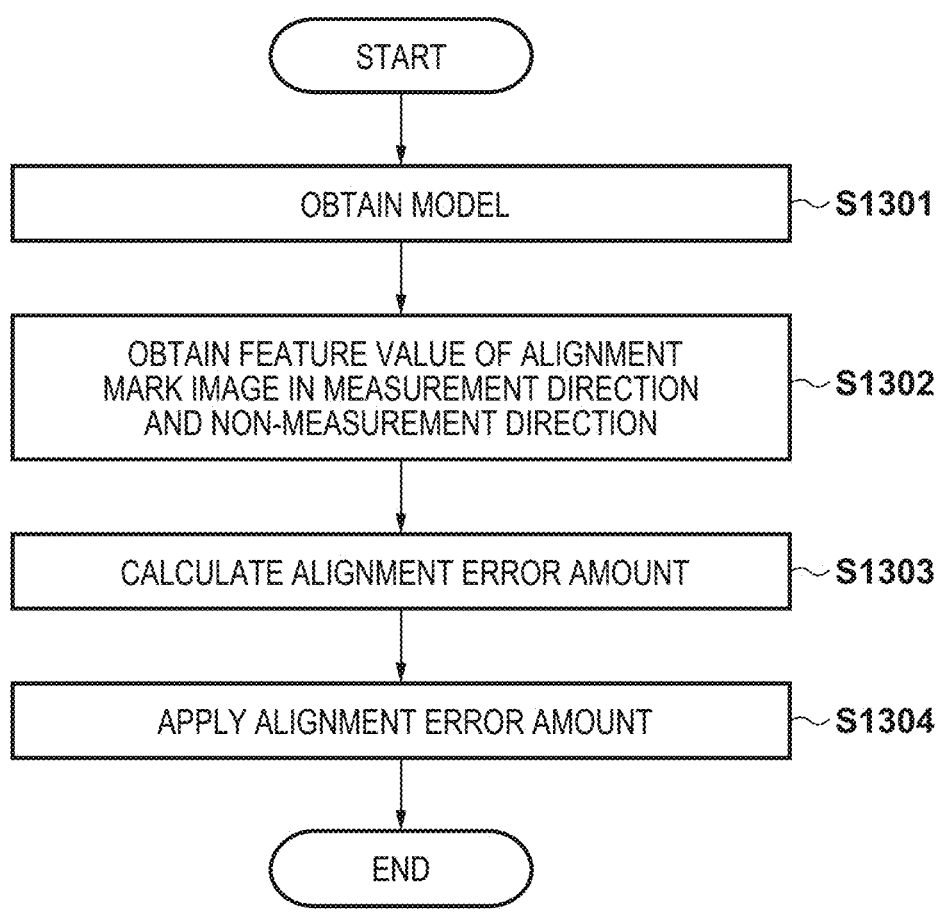
FIG. 13 is a flowchart exemplarily showing the processing of performing correction in alignment.

Processing executed in step S104 (alignment) will be described next with reference to FIG. 13. In this processing, the generated model is used to calculate an alignment error amount and/or a certainty factor.

In step S1301, the controller 110 obtains a model for the calculation of an error amount which is saved in the memory. Note that the model need not always obtained immediately before step S1302 and may be obtained, for example, before step S102 described above.

In step S1302, the controller 110 obtains the information (feature value) of the alignment mark image captured in step S104. In step S1303, the controller 110 calculates an alignment error amount by using the model obtained in step S1301 and the feature value obtained in step S1302. In this embodiment, the controller 110 obtains $y_{10}, \ldots, y_{m0}$ which satisfy $X_0 = C_1 y_{10} + C_2 y_{20} + C_3 y_{30} + \ldots + C_m y_{m0}$ with respect to an obtained image $X_0$ and $C_1, C_2, C_3, \ldots, C_m$ output in step S205. Thereafter, the controller 110 calculates a predicted error amount E' by using $y_{q0}$ with respect to the image component $C_q$ having the maximum correlation coefficient selected in the above process of specifying noise. The predicted error amount E' is represented by the following equation:

$$a \times y_{q0} + b = E'$$

Applying post-processing to this predicted error amount can adjust the correction amount. For example, it is possible to make the correction amount fall within predetermined values upon setting upper and lower limit values in advance or convert the scale by multiplying the value by a.

In step S1304, the controller 110 uses, as a correction amount for alignment measurement, the calculated alignment error amount or the value calculated based on the alignment error amount.

The certainty factor of error amount prediction can be obtained by using, as learning means, Bayesian inference in which inference with consideration to uncertainty is performed by using a variable as a probability. A certainty factor is an index (information) indicating the degree of certainty to which an estimated alignment error amount is accurate and may be understood as a certainty and/or reliability. Examples of a prediction model using Bayesian inference include Gaussian process regression, a generalized linear model, and a hierarchical Bayesian model. When a Bayesian inference model is to be used, the model is a function to which a feature value is input to output the probability distribution of alignment error amounts and in which internal variables are optimized by learning. An expected value of the obtained probability distribution of error amounts can be used as an inferred value of an error amount, and the variance of the probability distribution can be used as a certainty factor.

Abnormality detection in alignment can be performed by using this certainty factor or the value calculated based on the certainty factor. For example, there is available a method of detecting abnormality when the certainty factor is lower than a preset threshold. Upon receiving this abnormality detection, the controller 110 can perform control different from that for normal alignment.

This control different from that for normal alignment will be described by taking a specific example. Consider control to align the relative position between an original and a substrate to a target relative position for each shot region of the substrate by using the measurement value of one or more alignment marks arranged in each shot region. Assume that in this case, the design positions of the alignment marks on shot regions in the X direction are represented by $x_1$, $x_2$, . . . , and the design positions in the y direction are represented by $y_1$, $y_2$, . . . . Assume also that the alignment measurement values in the x direction are represented by $d_{x1}$, $d_{x2}$, . . . , and the alignment measurement values in the y direction are represented by $d_{y1}$, $d_{y2}$, . . . . These values are used to obtain target relative positions $s_x$, $s_y$, $\theta_x$, $\theta_y$, $\beta_x$, and $\beta_y$ that minimize an evaluation equation V given below:

$$V = \frac{1}{n}\sum_{i=1}^{n}\left\|\begin{bmatrix}dx_i\\dy_i\end{bmatrix}-\begin{bmatrix}\beta_x & -\theta_y\\\theta_x & \beta_y\end{bmatrix}\begin{bmatrix}x_i\\y_i\end{bmatrix}-\begin{bmatrix}s_x\\s_y\end{bmatrix}\right\|^2$$

where n is the number of alignment marks.

In this case, $s_x$ and $s_y$ represent shift components of a target relative position, $\theta_x$ and $\theta_y$ represent rotation components, and $\beta_x$ and $\beta_y$ represent stretch components. The controller 110 performs position control on at least the original or substrate based on these components.

In this case, if $d_{x1}$, $d_{x2}$, $d_{y1}$, $d_{y2}$, . . . include an extremely large abnormal value, each component at a relative position is greatly influenced by the abnormal value, and an accurate value cannot be calculated. The controller 110 calculates the certainty factor of the alignment mark in each shot region. If the certainty factor of a given mark is lower than a threshold, a relative position without the influence of the abnormal value can be calculated by calculating the relative positions with the measurement values of the remaining marks without using the measurement value of the given mark. Alternatively, the influence of an abnormal value can be reduced without providing any threshold by obtaining a target relative position according to the following equation including the multiplication of the measurement value of each mark by a weight w in accordance with the certainty factor.

$$V = \frac{1}{n}\sum_{i=1}^{n}\left\|\begin{bmatrix}dx_i w_{xi}\\dy_i w_{yi}\end{bmatrix}-\begin{bmatrix}\beta_x & -\theta_y\\\theta_x & \beta_y\end{bmatrix}\begin{bmatrix}x_i\\y_i\end{bmatrix}-\begin{bmatrix}s_x\\s_y\end{bmatrix}\right\|^2$$

It is also possible to prolong the time of alignment control when an abnormality is found and to perform normal alignment when the certainty factor increases. This is effective for a case in which when an alignment mark image is not normally formed because of insufficient filling of a pattern portion with an imprint material, the formation of the image is detected as an abnormality. In such a case, as the time elapses, an imprint material is sometimes filled normally form an alignment mark image, thus increasing the certainty factor of the mark.

(Measurement Condition Adjustment Method)

For example, the controller 110 can be configured to determine or adjust an adjustment parameter for adjusting the measurement apparatus based on the magnitude of each of a plurality of image components. In this case, the adjustment parameter can include at least one of the following: the position and orientation of a measurement target, the wavelength of illumination light generated by the scope, illumination σ value, NA (numerical aperture), and the position and orientation of an optical component of the scope. The following is a specific example.

When the above noise component is specified, accurate measurement can be performed by removing a main factor for the noise component in addition to alignment correction. For example, using a light source (wavelength) with high coherency sometimes causes interference fringes at an optical part in an alignment measurement apparatus or the like. If the interference fringes are overlaid on a measurement signal, measurement value deception can occur. Accordingly, this light source (wavelength) can be specified as a noise component. In such a case, for example, when a semiconductor laser for which a broadband wavelength is selected is to be used, there is conceivable a technique of reducing the coherency by, for example, modulating a driving current into a current having a broadband wavelength. In addition, the measurement deception is reduced by changing the direction of interference fringes to a direction in which a measurement value is free from the influence of the interference fringes by, for example, providing a driving system for an optical part that causes interference fringes to tilt the optical part, thereby enabling accurate measurement. Furthermore, when measurement deception has occurred as the surface shape of an alignment mark is deformed, the measurement is expected to be improved by using another alignment mark in the shot region for measurement. Moreover, it is possible to change the material and the like and the polishing conditions (the polishing direction, the polishing material, and the like) in a step before imprinting in addition to the parameters in the imprint apparatus.

These adjustment methods can be implemented by transmitting information such as the image component output in step S205 and its magnitude to the control device 1003 and sending a parameter change command to each apparatus. The control device 1003 may automatically determine a command value based on received information or may determine a command value in accordance with an instruction from the user. Alternatively, the above adjustment method can be implemented by transmitting the information to an external calculation device and making each apparatus use the parameters obtained by the device. In addition, displaying the information allows the operator to change a parameter in accordance with the value. Furthermore, monitoring image components and their magnitudes makes it possible to maintain the quality at the time of mass production. For example, there is available a method of notifying the outside of a change upon occurrence of the change.

Second Embodiment

Figure 14:
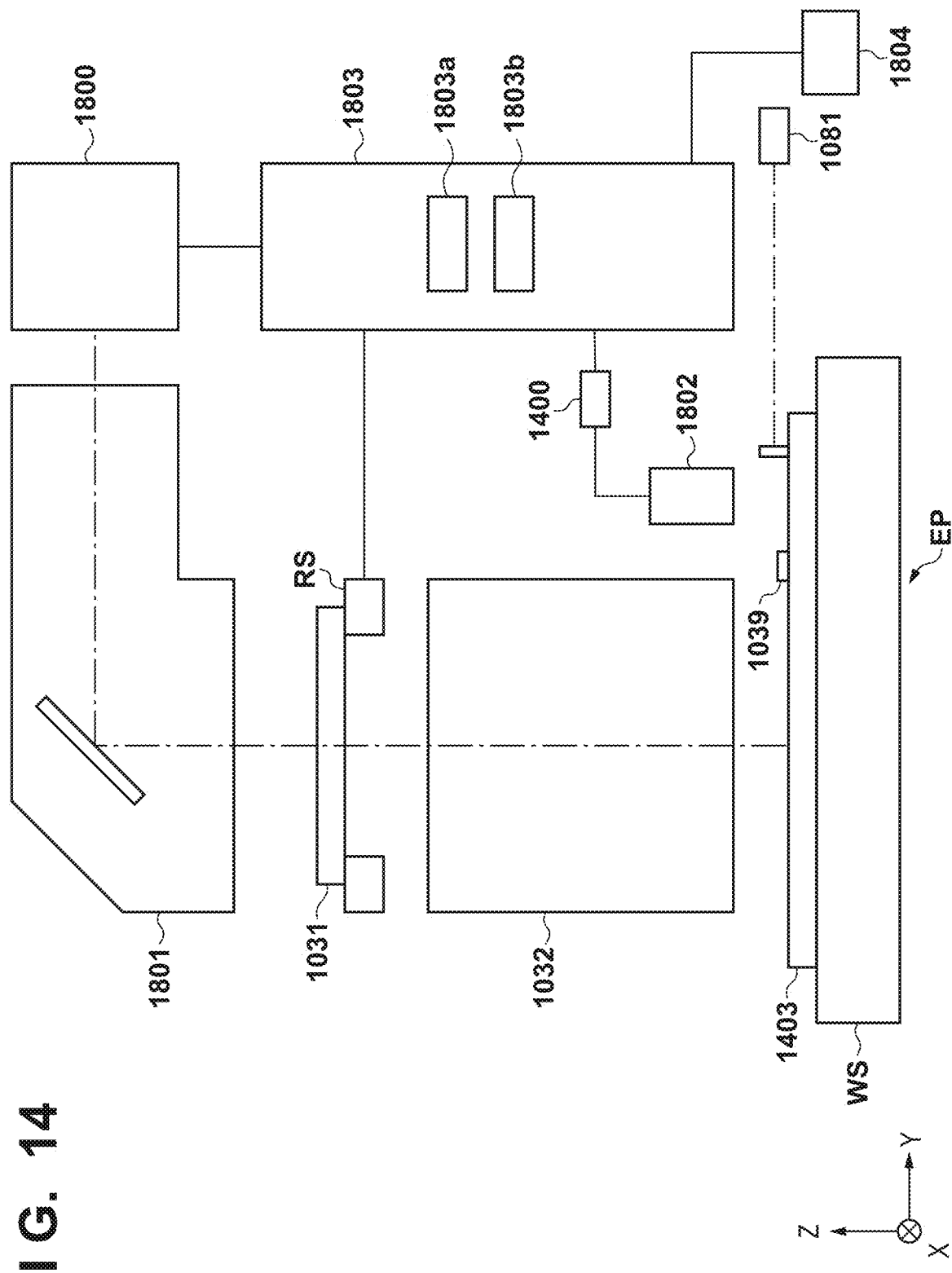
FIG. 14 is a view exemplarily showing the arrangement of an exposure apparatus.

FIG. 14 schematically shows the arrangement of an exposure apparatus EP according to the second embodiment. The exposure apparatus EP can include an illumination device 1800, a reticle stage RS on which a reticle 1031 (original) is placed, a projection optical system 1032, a substrate stage WS on which a substrate 1403 is placed, a measurement apparatus 1802, and an arithmetic processing device 1400. A reference plate 1039 is placed on the substrate stage WS. A controller 1803 is electrically connected to the illumination device 1800, the reticle stage RS, the substrate stage WS, and the measurement apparatus 1802 and controls them. In this embodiment, the controller 1803 can cause the measurement apparatus 1802 to perform a correction operation and control with respect to the measurement value of the height position of the surface of the substrate 1403. The controller 1803 can be formed by, for example, a PLD such as an FPGA, an ASIC, a general-purpose computer installed with a program, or a combination of all or some of these components. For example, the controller 1803 can include a processor 1803*a* and a storage device 1803*b* storing programs and data.

The illumination device 1800 includes a light source unit 1810 and an illumination optical system 1801 and illuminates the reticle 1031 on which a circuit pattern to be transferred is formed. The illumination optical system 1801 has a function of uniformly illuminating the reticle 1031 and a deflecting illumination function. The light source unit 1810 uses, for example, a laser. As the laser, it is possible to use an ArF excimer laser with a wavelength of about 193 nm, a KrF excimer laser with a wavelength of about 248 nm, or the like. However, the type of light source is not limited to excimer lasers. For example, an F2 laser with a wavelength of about 157 nm or extreme ultraviolet (EUV) light with a wavelength of 20 nm or less may be used.

The illumination optical system 1801 is an optical system that illuminates a surface to be illuminated by using a light beam emitted from the light source unit 1810. In this embodiment, the illumination optical system 1801 forms a light beam with an exposure slit having a predetermined shape optimal for exposure and illuminates the reticle 1031. The illumination optical system 1801 can include lenses, mirrors, an optical integrator, and a stop. For example, these components are arranged from the light source side in the order of a condenser lens, a fly-eye lens, an aperture stop, a condenser lens, a slit, and an imaging optical system.

The reticle 1031 is formed from, for example, quartz, on which a circuit pattern to be transferred is formed. The reticle 1031 is supported and driven by the reticle stage RS. Diffracted light emerging from the reticle 1031 passes through the projection optical system 1032 and is projected on the substrate 1403. The reticle 1031 and the substrate 1403 are arranged in an optically conjugate relationship. The reticle 1031 and the substrate 1403 are scanned at a velocity ratio corresponding to a reduction magnification ratio to transfer the pattern of the reticle 1031 onto the substrate 1403. Note that the exposure apparatus EP is provided with a reticle detector of an oblique incidence system (not shown). The position of the reticle 1031 is detected by the reticle detector. The reticle 1031 can be arranged at a predetermined position.

The reticle stage RS supports the reticle 1031 through a reticle chuck (not shown) and is connected to a moving mechanism (not shown). The moving mechanism is constituted by a linear motor and the like and has a plurality of degrees of freedom (for example, three axes including the X-axis, Y-axis, and θZ-axis, and preferably six axes including the X-axis, Y-axis, Z-axis, θX-axis, θY-axis, and θZ-axis). The moving mechanism can move the reticle 1031 by driving the reticle stage RS.

The projection optical system 1032 has a function of forming an image of a light beam from an object surface onto an imaging plane. In this embodiment, the projection optical system 1032 forms an image of diffracted light passing through the pattern formed on the reticle 1031 onto the substrate 1403. As the projection optical system 1032, it is possible to use, for example, an optical system including a plurality of lens elements, an optical system (catadioptric optical system) having a plurality of lens elements and at least one concave mirror, and an optical system having a plurality of lens elements and at least one diffraction optical element such as a kinoform optical element.

The substrate 1403 is an object to be processed, on which a photoresist is applied. In this embodiment, the substrate 1403 is an object to be detected, on which the position of a mark 1039 is detected by the measurement apparatus 1802. In addition, the substrate 1403 is an object to be detected, on which a surface position is detected by a surface position detector (not shown). Note that the substrate 1403 may be a liquid crystal substrate or another type of object to be processed.

The substrate stage WS supports the substrate 1403 with a substrate chuck (not shown). The substrate stage WS is constituted by a linear motor and the like, like the reticle stage RS, has a plurality of degrees of freedom (for example, three axes including the X-axis, Y-axis, and θZ-axis, and preferably six axes including the X-axis, Y-axis, Z-axis, θX-axis, θY-axis, and θZ-axis), and moves the substrate 1403. For example, a 6-axis laser interferometer 1081 and the like monitor the position of the reticle stage RS and the position of the substrate stage WS. A stage controller 1804 drives the two components at a predetermined velocity ratio.

Figure 15:
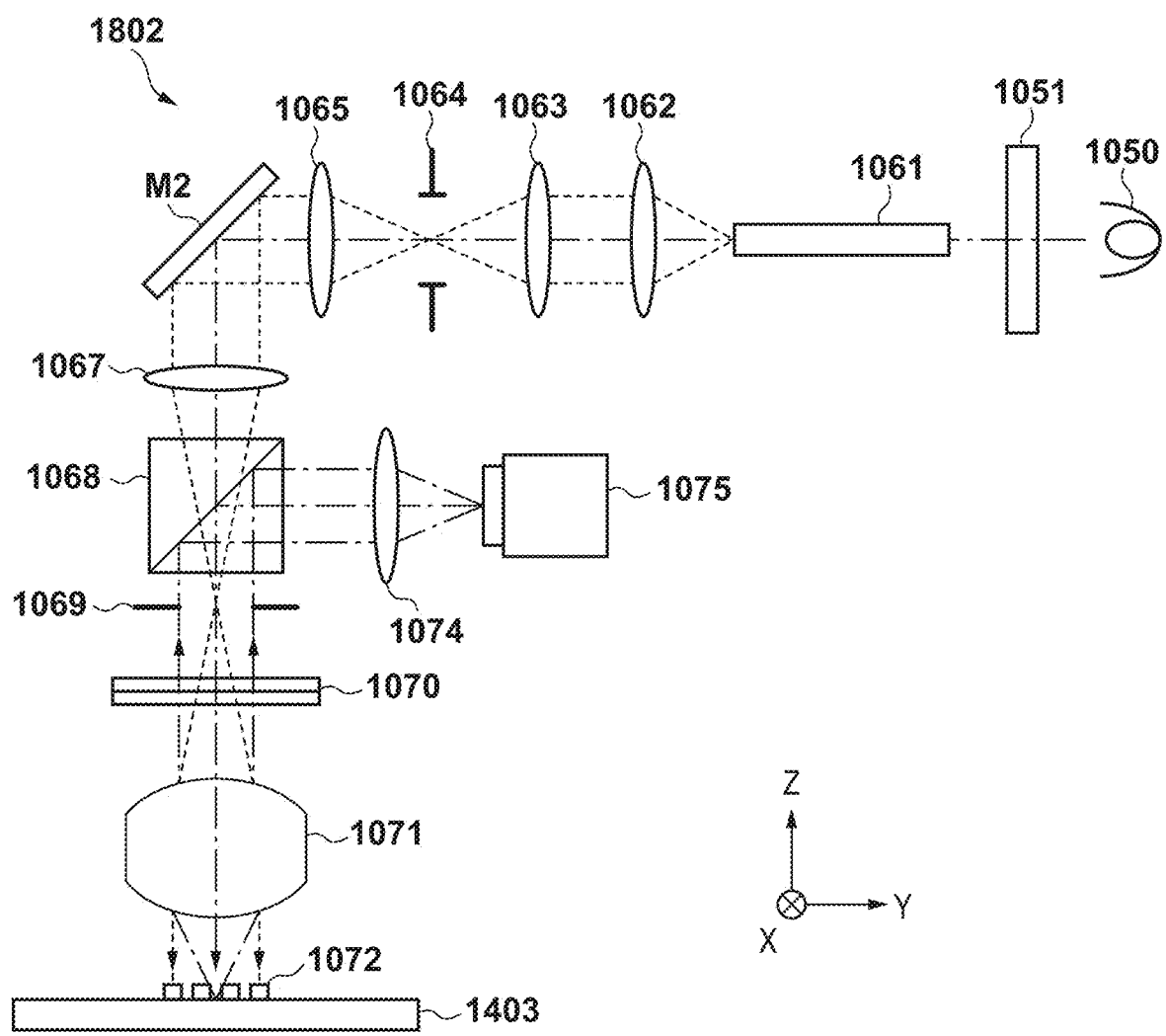
FIG. 15 is a view exemplarily showing the arrangement of a measurement apparatus.

FIG. 15 shows an example of the arrangement of the measurement apparatus 1802. The measurement apparatus 1802 can include an illumination system that illuminates the substrate 1403 with light emerging from an optical fiber 1061 and an imaging system that forms an image of a mark 1072 provided on the substrate 1403. The illumination system can include illumination optical systems 1062, 1063, and 1065, an illumination aperture stop 1064, a mirror M2, a relay lens 1067, a polarizing beam splitter 1068, a λ/4 plate 1070, and an objective optical system 1071. The imaging system includes the objective optical system 1071, the λ/4 plate 1070, a detection aperture stop 1069, the polarizing beam splitter 1068, and an imaging optical system 1074 and is configured to form an image of reflected light from the mark 1072 onto an image capturing sensor 1075. The measurement apparatus 1802 obtains the coordinate position of the mark 1072 based on the position information of the substrate stage WS measured by the laser interferometer 1081 and the signal waveform detected concerning the mark 1072.

In the measurement apparatus 1802, light emerging from the optical fiber 1061 passes through the illumination optical systems 1062 and 1063 and reaches the illumination aperture stop 1064 arranged at a position conjugate to the substrate 1403. At this time, the light beam diameter at the illumination aperture stop 1064 is sufficiently smaller than that at the optical fiber 1061. The light having passed through the illumination aperture stop 1064 is guided to the polarizing beam splitter 1068 through the illumination optical system 1065, the mirror M2, and the relay lens 1067. P-polarized light parallel to the Y direction is transmitted through the polarizing beam splitter 1068, whereas S-polarized light parallel to the X direction is reflected by the polarizing beam splitter 1068. Accordingly, the P-polarized light transmitted through the polarizing beam splitter 1068 is transmitted through the λ/4 plate 1070 through the detection aperture stop 1069 to be converted into circularly polarized light, which then passes through the objective optical system 1071 and Kohler-illuminates the mark 1072 formed on the substrate 1403.

The light reflected, diffracted, and scattered by the mark 1072 passes through the objective optical system 1071 again and then passes through the λ/4 plate 1070 to be converted from the circularly polarized light into S-polarized light, which then reaches the detection aperture stop 1069. In this case, the polarized state of the light reflected by the mark 1072 is a state in which the light is circularly polarized in a direction reverse to the circularly polarized light applied to the mark 1072. That is, when the polarized state of the light applied to the mark 1072 is a clockwise circularly polarized state, the polarized state of the light reflected by the mark 1072 is a counterclockwise circularly polarized state. The detection aperture stop 1069 changes the stop value in accordance with an instruction from the controller 1803 to change the numerical aperture NA of reflected light from the mark 1072. The light having passed through the detection aperture stop 1069 is reflected by the polarizing beam splitter 1068 and then guided to an image capturing sensor 1075 through an imaging optical system 1074. Accordingly, the polarizing beam splitter 1068 splits the optical path of illumination light to the substrate 1403 from the optical path of reflected light from the substrate 1403. An image of the mark 1072 provided on the substrate 1403 is then formed on the image capturing sensor 1075.

The optical fiber 1061 guides light from a light source 1050 formed from, for example, a separately placed halogen lamp, metal halide lamp, plasma light source, or LED. A wavelength filter 51 that changes the wavelength of light transmitted therethrough is arranged between the light source 1050 and the optical fiber 1061. The wavelength filter 51 is configured to pass a wavelength range selected based on the quality of an image obtained upon observation of the mark 1072 (for example, contrast or measurement deception (to be described later)).

Figure 16:
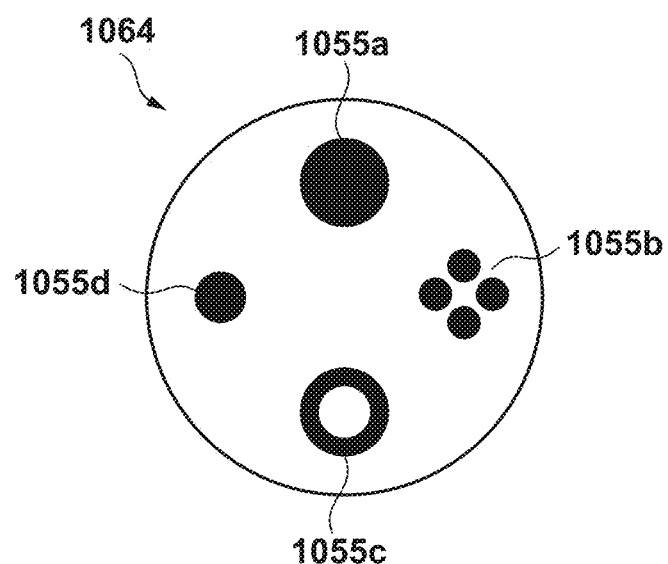
FIG. 16 is a view exemplarily showing the arrangement of an illumination aperture stop in a positioning device.

The illumination aperture stop 1064 has a switching mechanism (for example, a rotating mechanism) (not shown) and can change the shape of a light source distribution transmitted through the illumination aperture stop. For example, the illumination aperture stop 1064 can selectively change the size (so-called illumination σ value) of the aperture portion and can provide modified illumination or the like. In addition, changing the shape of the aperture portion can also change the quality of an image of the mark 1072 as will be described later. The illumination aperture stop 1064 has, for example, four aperture portions 1055a, 1055b, 1055c, and 1055d, like those shown in FIG. 16, formed in a disk. As the disk rotates, one of the four aperture portions is arranged on the optical axis. Selecting an aperture portion to be arranged on the optical axis in this manner can change the illumination state. Note that mechanisms for deforming an illumination state are not limited to those described in this example, and those skilled in the art can easily figure out that various effects can be obtained by various shapes or combinations.

As described above, the quality of an image of the mark 1072 can be changed by changing optical parameters such as the wavelength, the illumination aperture stop 1064, and the detection aperture stop 1069. An example of this case will be described with reference to FIG. 17 and FIGS. 18A to 18E.

Figure 17:
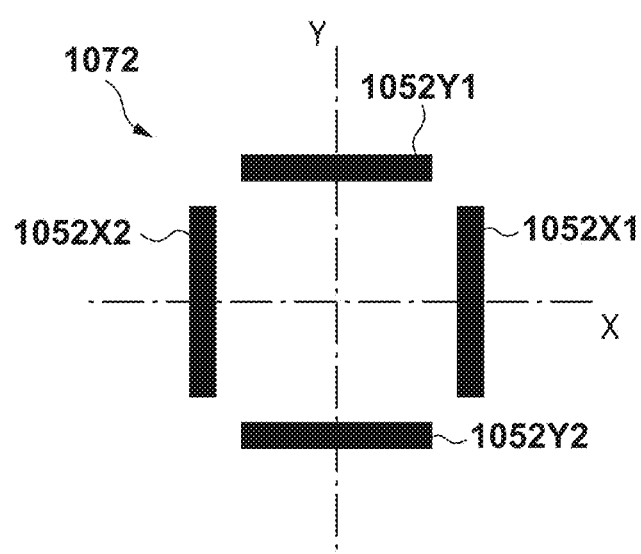
FIG. 17 is a view exemplarily showing the arrangement of an alignment mark.

FIG. 17 shows an example of the mark 1072 in an X-Y plane. The mark 1072 includes two marks $1052X_1$ and $1052X_2$ arranged side by side in the X direction and two marks $1052Y_1$ and $1052Y_2$ arranged side by side in the Y direction. In measurement of the mark 1072 by the measurement apparatus 1802, process influences such as CMP, etching, and resist coating unevenness can cause measurement errors. In the case of such a mark for measurement in two directions, in particular, asymmetry in mark shape (to be described later) can occur in a non-measurement direction as well as the measurement direction.

Figure 18A:
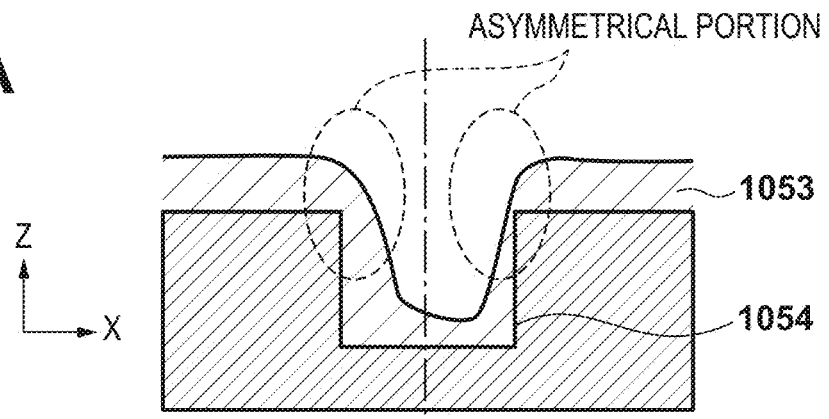
FIGS. 18A to 18E are views for explaining the optical parameter dependence of a signal waveform (measurement direction) obtained from the image data of an alignment mark.

FIG. 18A shows a cross-section (Z-X cross-section) of only one mark of interest (for example, the mark $1052X_2$) of the mark 1072 shown in FIG. 17. This mark has a stepped structure 1054, on which a resist 1053 is applied. As the resist 1053, a liquid resist is generally applied on the substrate by spin coating. When the mark is coated with the liquid resist 1053, resist coating may be performed asymmetrically with respect to the stepped structure 1054. When the mark is coated with the resist in such an asymmetrical state, the observed alignment image becomes also asymmetrical, resulting in measurement deception.

Figure 18B:
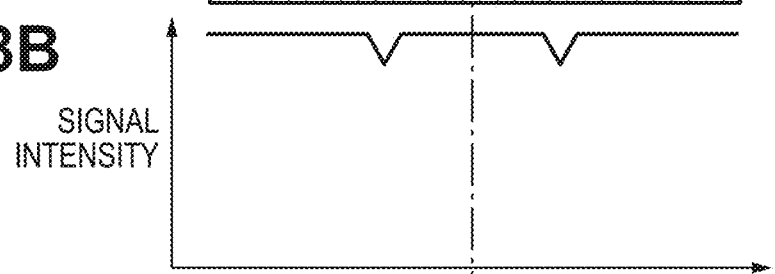
Figure 18C:
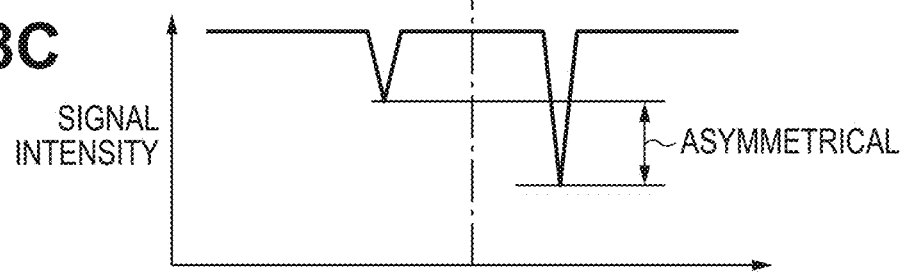

FIGS. 18B to 18E each show an example of the signal waveform of a mark image. In this case, the abscissa represents the position in the X direction, and the ordinate represents the signal intensity. FIG. 18B shows a signal waveform when optical parameters (the wavelength of illumination light and illumination σ value) are respectively set to predetermined values. This signal waveform indicates that the signal intensity differences at the mark edges are small, and the contrast is low. When the contrast is low as in this case, the measurement accuracy is low. Accordingly, the controller 1803 changes optical parameters so as to enhance the contrast. FIG. 18C shows the signal waveform of the mark image obtained by changing the wavelength of illumination light of the optical parameters set when the signal waveform shown in FIG. 18B is obtained. According to this signal waveform, although the signal intensity differences at the mark edges are amplified, since the coated state of the resist 1053 is asymmetrical, the signal intensities at the left and right mark edges become asymmetrical, resulting in a measurement error.

Figure 18D:
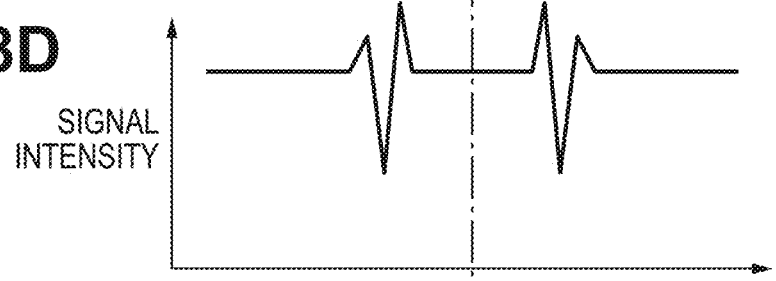

FIG. 18D shows the signal waveform of the mark image obtained by changing the illumination σ value of the optical parameters set when the signal waveform in FIG. 18C is obtained. Reducing the illumination σ value amplifies the signal intensity differences at the mark edges and enhances the contrast while maintaining the symmetry of the signal intensities at the left and right mark edges. This phenomenon can be adjusted by changing the focus position of the mark 1072. More specifically, changing the focus position of the mark 1072 can change the amount of enhancement of the contrast, the position in the X direction at which the contrast is enhanced, and the like. Therefore, the measurement apparatus 1802 can measure the optimal focus position in accordance with measurement conditions (contrast, measurement deception, and the like).

Figure 18E:
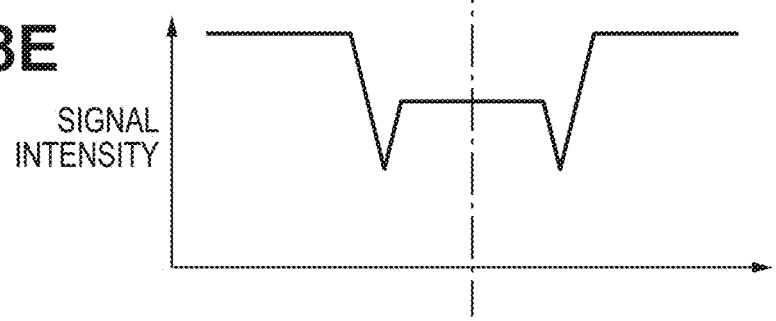

FIG. 18E shows the signal waveform of the mark image obtained by changing the wavelength of illumination light of the optical parameters set when the signal waveform in FIG. 18B is obtained. Assume that since the resist 1053 is applied on the mark, the interference conditions at the concave and convex portions of the stepped structure 1054 differ, and a large phase difference between them occurs. In this case, the relationship between the signal intensity at the concave portion and the signal intensity at the convex portion changes. In the case of a mark used for an actual semiconductor process instead of the simple stepped mark in this example, a change in contrast caused by a change in the wavelength of illumination light tends to be more conspicuous. In any case, when the wavelength is changed in accordance with a mark, the obtained mark image changes in state.

Figure 19A:
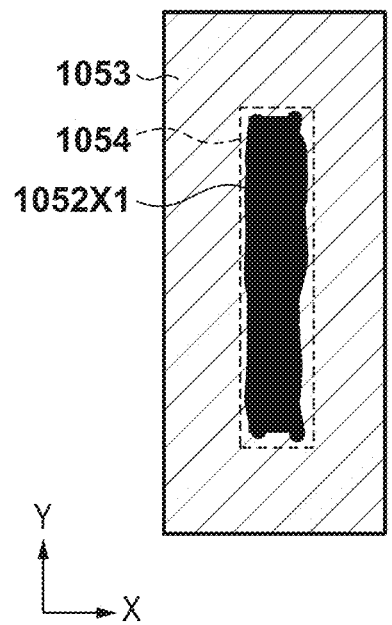
FIGS. 19A to 19E are views for explaining the optical parameter dependence of a signal waveform (non-measurement direction) obtained from the image data of an alignment mark.

FIG. 19A is a plan view (X-Y plan view) of only the mark $1052X_1$, of the mark 1072 shown in FIG. 17, which is coated with a resist. The mark has the stepped structure 1054, on which the resist 1053 is applied. As the resist 1053, a liquid resist is generally applied on the substrate by spin coating. When the mark is coated with the liquid resist 1053, resist coating may be performed asymmetrically with respect to the stepped structure 1054 in the non-measurement direction (the Y direction in FIG. 19A) as well as the measurement direction. When the mark is coated with the resist in such an asymmetrical state, the edge shape of the observed alignment image in the non-measurement direction becomes also asymmetrical. The degree of asymmetry is similar to that in the measurement direction and corresponds to the magnitude of the measurement error in the measurement direction. As described above, the signal intensity obtained by integration in the non-measurement direction regarded as the abscissa (the X-axis in FIG. 19A) becomes constant when the mark is uniformly coated with the resist and greatly changes when the mark is non-uniformly coated with the resist. Accordingly, the signal intensity obtained by integration in the non-measurement direction can be regarded as a feature value that can more distinctly discriminate the unevenness of the coated state of a resist, that is, the degree of asymmetry.

Figure 19B:
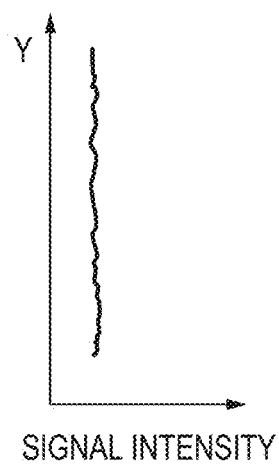
Figure 19C:
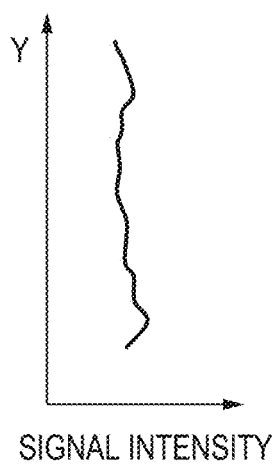

FIGS. 19B to 19E each show an example of the waveform of the signal intensity obtained by integration in the non-measurement direction of the mark image. In this case, the ordinate represents the position in the Y direction, and the abscissa represents the signal intensity. FIG. 19B shows a signal waveform when optical parameters (the wavelength of illumination light and illumination σ value) are respectively set to predetermined values. This signal waveform represents that the signal intensity (contrast) is low. When the signal intensity is low as in this case, since the measurement accuracy decreases, the controller 1803 changes the optical parameters so as to increase the signal intensity. FIG. 19C shows the signal waveform of the mark image obtained by changing the wavelength of the illumination light of the optical parameters set when the signal waveform in FIG. 19B is obtained. This signal waveform indicates that although the signal intensity is amplified, a change in signal intensity due to the asymmetrical coated state of the resist is enhanced, and a measurement error occurs in this state.

Figure 19D:
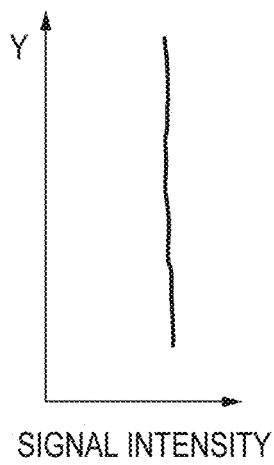

FIG. 19D shows the signal waveform of the mark image obtained by reducing the illumination σ value of the optical parameters set when the signal waveform in FIG. 19C is obtained. Reducing the illumination σ value can enhance the signal intensity at portions corresponding to the mark edges and increasing the contrast. This phenomenon can be adjusted by changing the focus position of the mark 1072. More specifically, changing the focus position of the mark 1072 can change the amount of enhancement of contrast, the position in the X direction at which enhancement occurs, and the like. Accordingly, the measurement apparatus 1802 can measure an optimal focus position in accordance with measurement conditions (contrast, measurement deception, and the like). In a state in which the focus position is properly adjusted, the influence of the asymmetry of a resist is reduced, and a change in obtained signal intensity is reduced, thereby providing a state suitable for alignment.

Figure 19E:
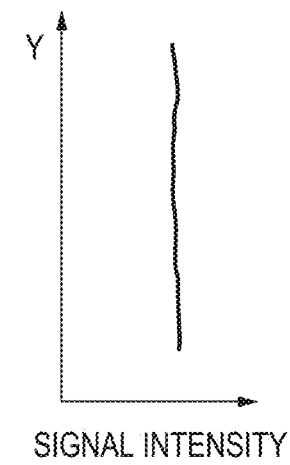

FIG. 19E shows the signal waveform of the mark image obtained by increasing the wavelength of illumination light of the optical parameters set when the signal waveform in FIG. 19B is obtained. Since the mark is coated with the resist 1053, the interference conditions at the concave and convex portions differ from each other. When the corresponding phase difference is large, the relationship between the signal intensity at the concave portion and the signal intensity at the convex portion changes. The change in the signal waveform in FIG. 19E is slightly larger than that in the signal waveform in FIG. 19D. In the case of a mark used for an actual semiconductor process, a change in signal in the non-measurement direction which is caused by a change in the wavelength of illumination light tends to become more conspicuous than in the case of the simple stepped mark in this example. In any case, when the wavelength is changed in accordance with a mark, the obtained mark image changes in state.

Owing to various factors, however, in a semiconductor process, measurement sometimes cannot be performed under conditions with less deception as represented in FIGS. 18D and 18E, or the deception shown in FIG. 18C sometimes occurs under any optical conditions. In such a case, accurate alignment measurement can be implemented by extracting a noise waveform component that causes a measurement position error from the deformed state of an alignment waveform by principal component analysis, further calculating the correction amount, and performing correction.

Figure 20B:
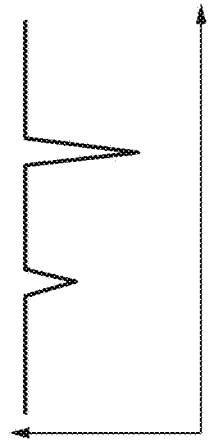
FIGS. 20A to 20F are views exemplarily showing signal waveforms obtained from the image data of an alignment mark in an alignment sample shot region.
Figure 20E:
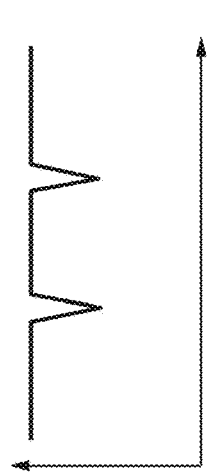
Figure 20C:
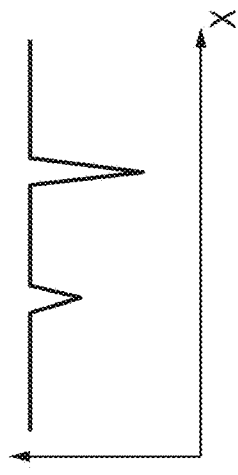
Figure 20F:
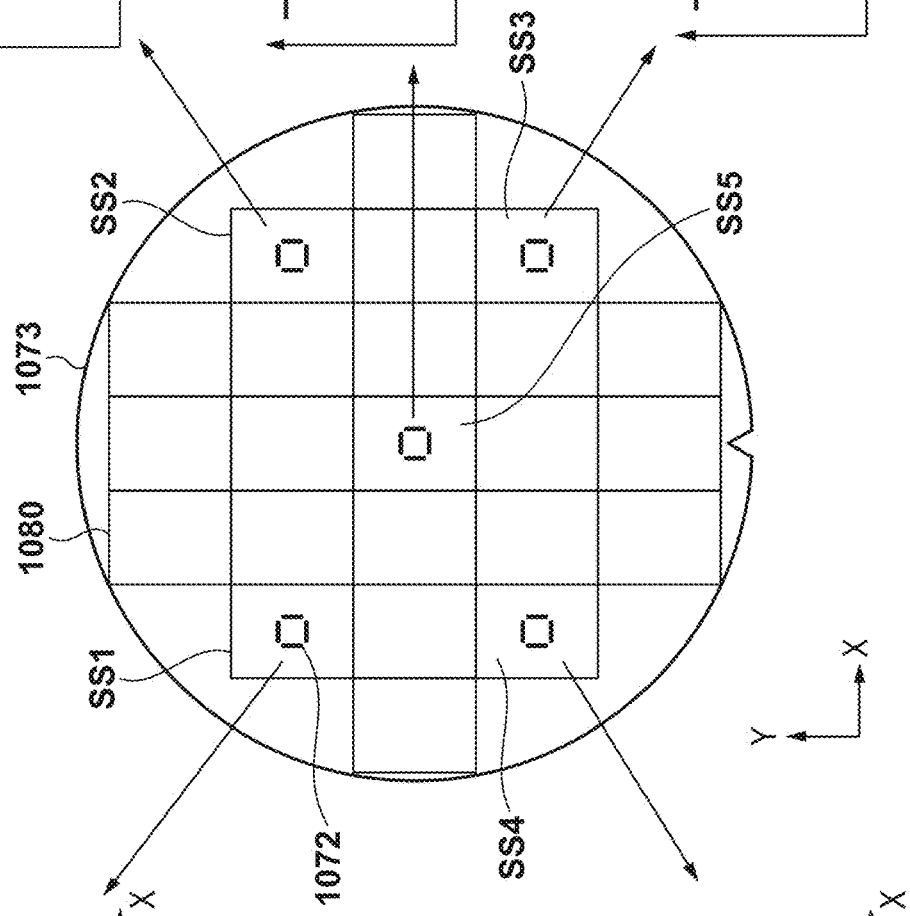
Figure 20A:
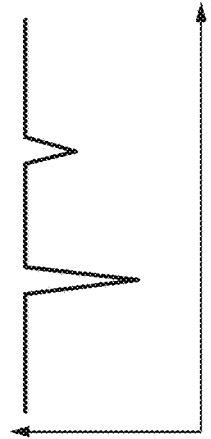
Figure 20D:
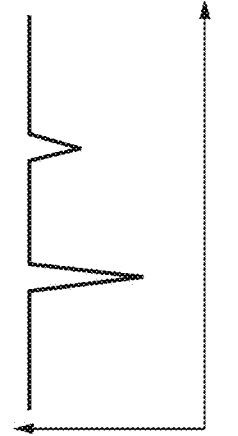

FIG. 20F shows a plurality of shot regions 1080 on a substrate 1073. The plurality of shot regions 1080 include alignment sample shot regions SS1 to SS5. The mark 1072 is formed on each alignment sample shot region. In general, since a resist is applied by spin coating, the unevenness of resist coating shown in FIG. 18A occurs concentrically about the center of the substrate. FIGS. 20A to 20E each show an alignment signal in the X direction in this case. The signal waveforms in FIGS. 20A to 20E each have an asymmetrical shape when viewed individually. However, as a whole, some signal waveform becomes line-symmetrical with respect to the substrate central line parallel to the Y direction. However, since each signal waveform changes depending on the structure of a peripheral portion (actual element region) of an alignment mark, spin coater unevenness, variations in spin coating conditions, and the like as well as the stepped structure of the alignment mark, line symmetry does not always appear as a whole. Accordingly, as described above, a correction value may be calculated from the distortion of a waveform by comparing measurement values (predicted values) obtained by the overlay inspection apparatus related to these obtained alignment images (signals), and alignment may be performed by using the correction value when the substrate is exposed later.

When a noise waveform component is detected upon alignment measurement under predetermined optical conditions and principal component analysis, a measurement error can be reduced by changing the optical conditions. In this case, an image is obtained by measuring the same substrate and the same mark under a plurality of optical conditions. This processing is performed with respect to a plurality of substrates and a plurality of marks, and principal component analysis is executed. Principal component analysis is performed by comparing the alignment measurement values and images obtained under the respective optical conditions and specific overlay results to obtain optical conditions under which no noise waveform component is detected. This makes it possible to find out optimal optical conditions.

This principal component analysis may be executed with respect to a so-called "test substrate" to correct a subsequent "production substrate" based on the analysis result. Alternatively, the principal component analysis may always be performed with respect to a "production substrate", and the model in use may be corrected for each operation.

In the above case, the waveform of a mark has been described as a one-dimensional waveform. However, the present invention is not limited to this. In the case of a two-dimensional image, principal component analysis can be also performed with respect to information in the non-measurement direction. This technique is especially effective for a mark for measuring two directions as described in this example.

For an alignment mark in the above apparatus arrangement as well, a noise component can be specified as in the case of an alignment mark image and an alignment waveform in the first embodiment.

<Embodiment of Article Manufacturing Method>

An article manufacturing method of manufacturing an article using the above lithography apparatus will be described. The article manufacturing method includes a transfer step of transferring a pattern of an original onto a substrate by using the lithography apparatus and a processing step of processing the substrate through the transfer step and obtains an article from the substrate having undergone the processing step.

Figure 21:
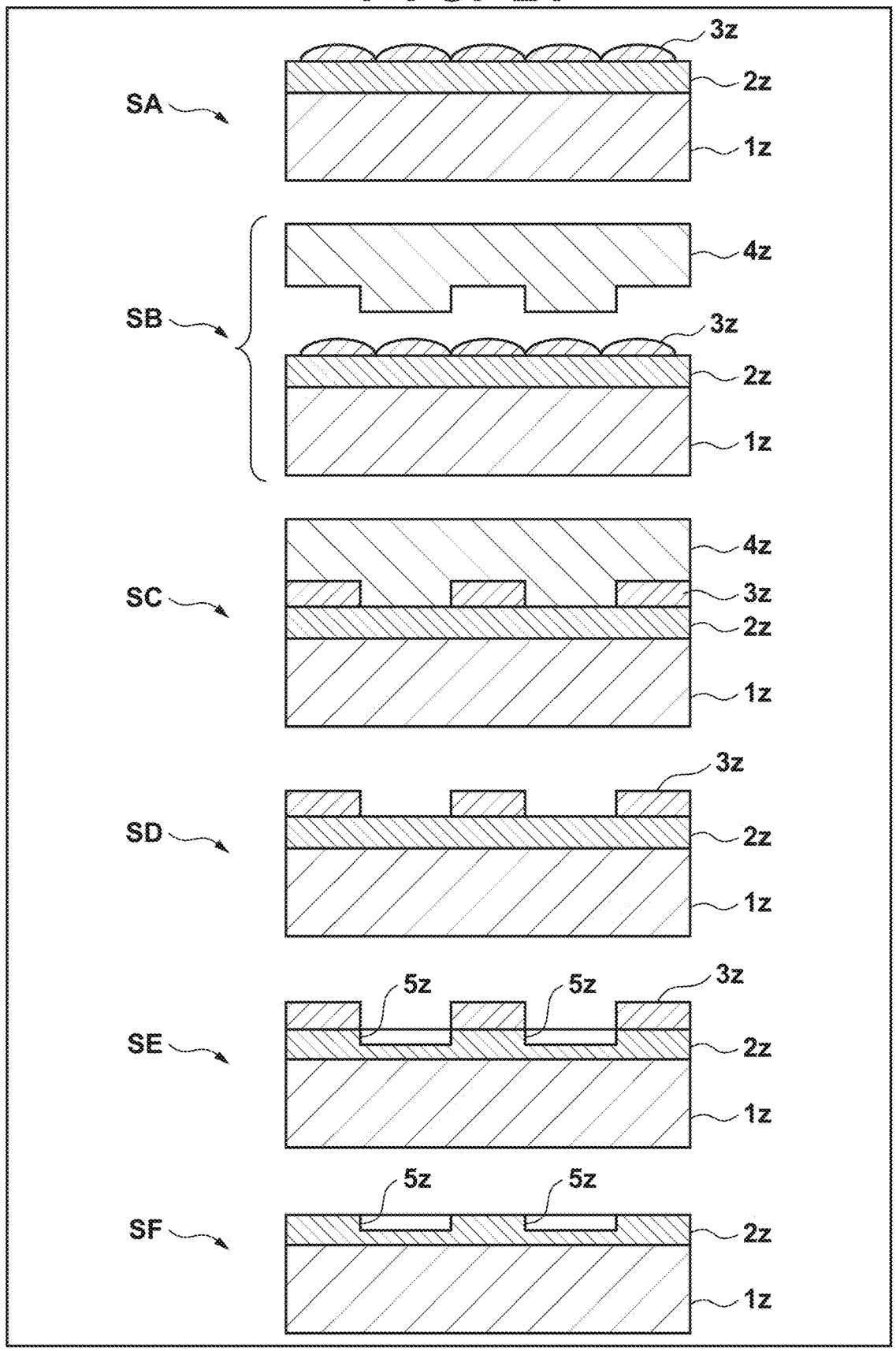
FIG. 21 is a view for explaining an article manufacturing method.

Referring to FIG. 21, an article manufacturing method for manufacturing an article using an imprint apparatus, which is an example of a lithography apparatus, is described. A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 21, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

As shown in step SB of FIG. 21, a side of an imprinting mold 4z on which its three-dimensional pattern is formed faces the imprint material 3z on the substrate. In step SC of FIG. 21, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 21, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 21, when the pattern of the cured material is etched as an etching resistant mask, portions out of the surface of the processing target material 2z where the cured material is not present or thinly remains are removed, and grooves 5z are achieved. In step SF of FIG. 21, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-201173, filed Dec. 10, 2021, which is hereby incorporated by reference herein in its entirety.

What is claimed is:

1. A measurement apparatus that measures position information of a measurement target, the apparatus comprising:
    a scope configured to generate an image by capturing an image of the measurement target; and
    a processor configured to obtain position information of the measurement target based on the image,
    wherein the processor is configured to:
        generate a plurality of image components using a statistical technique from a plurality of images generated by the scope;
        output the plurality of generated image components;
        perform processing for determining a component related to a measurement error based on the plurality of generated image components; and
        determine the position information based on the generated image of the measurement target by the scope and the component related to the measurement error.

2. The apparatus according to claim 1, wherein the processor is configured to output the plurality of image components to a display device.

3. The apparatus according to claim 1, wherein the processing includes the processor:
generating the plurality of image components and information indicating a magnitude of each of the plurality of image components from the plurality of images using the statistical technique;
calculating a correlation coefficient between the magnitude of each of the plurality of image components and a value related to the measurement error; and
evaluating, based on the correlation coefficient, an influence which each of the plurality of image components exerts on the measurement error.

4. The apparatus according to claim 3, wherein the evaluating includes specifying an image component, of the plurality of image components, which has a correlation coefficient higher than a predetermined value as an image component including a noise component influencing the measurement error.

5. The apparatus according to claim 3, wherein the processor is configured to:
obtain provisional position information of the measurement target based on the image; and
determine the position information by correcting the provisional position information by a correction value based on the value related to the measurement error.

6. The apparatus according to claim 5, further comprising a model configured to obtain the value related to the measurement error based on a feature value of the image.

7. The apparatus according to claim 6, further comprising a machine learning device configured to generate the model by machine learning.

8. The apparatus according to claim 7, wherein the machine learning device is configured to perform machine learning using the feature value as input data of a model and using, as training data, a difference between position information of a measurement target measured by an external inspection apparatus and position information determined by the processor.

9. The apparatus according to claim 3, wherein the processor is configured to determine an adjustment parameter for adjusting the measurement apparatus based on the magnitude of each of the plurality of image components.

10. The apparatus according to claim 9, wherein the adjustment parameter includes at least one of a position and orientation of the measurement target, a wavelength of illumination light generated by the scope, an illumination σ value, a numerical aperture (NA), or a position and orientation of an optical part constituting the scope.

11. The apparatus according to claim 1, wherein the statistical technique is one of principal component analysis, an autoencoder, or independent component analysis.

12. The apparatus according to claim 1, wherein the measurement target is a mark.

13. The apparatus according to claim 1, wherein:
the measurement target is moiré fringes formed by a first mark of a first member and a second mark of a second member, and
the position information is relative position information between the first mark and the second mark.

14. A measurement apparatus that measures position information of a measurement target, the apparatus comprising:
a scope configured to generate an image by capturing an image of the measurement target; and
a processor configured to obtain position information of the measurement target based on a signal waveform obtained from the image,
wherein the processor is configured to:
generate a plurality of signal waveform components using a statistical technique from a plurality of signal waveforms obtained from a plurality of images generated by the scope;
output the plurality of generated signal waveform components;
perform processing for determining a component related to a measurement error based on the plurality of generated signal waveform components; and
determine the position information based on the image generated image of the measurement target by the scope and the component related to the measurement error.

15. A lithography apparatus that transfers a pattern of an original onto a substrate, the apparatus comprising:
a measurement apparatus that measures position information of a measurement target, the apparatus comprising:
a scope configured to generate an image by capturing an image of the measurement target; and
a processor configured to obtain position information of the measurement target based on the image,
wherein the processor is configured to:
generate a plurality of image components using a statistical technique from a plurality of images generated by the scope;
output the plurality of generated image components;
perform processing for determining a component related to a measurement error based on the plurality of generated image components; and
determine the position information based on the generated image of the measurement target by the scope and the component related to the measurement error,
wherein alignment between the substrate and the original is executed based on an output from the measurement apparatus.

16. An article manufacturing method comprising:
transferring a pattern onto a substrate using a lithography apparatus defined in claim 15; and
processing the substrate having undergone the transferring, and
obtaining an article from the substrate having undergone the processing.

* * * * *